(12) United States Patent
Huang

(10) Patent No.: US 10,504,841 B2
(45) Date of Patent: Dec. 10, 2019

(54) SEMICONDUCTOR PACKAGE AND METHOD OF FORMING THE SAME

(71) Applicant: Shun-Ping Huang, Zhubei (TW)

(72) Inventor: Shun-Ping Huang, Zhubei (TW)

( * ) Notice: Subject to any disclaimer, the term of this patent is extended or adjusted under 35 U.S.C. 154(b) by 0 days.

(21) Appl. No.: 15/956,055

(22) Filed: Apr. 18, 2018

(65) Prior Publication Data

US 2019/0229061 A1    Jul. 25, 2019

Related U.S. Application Data

(60) Provisional application No. 62/619,834, filed on Jan. 21, 2018.

(51) Int. Cl.
| *H01L 23/532* | (2006.01) |
| *H01L 21/67* | (2006.01) |
| *H01L 23/00* | (2006.01) |
| *H01L 23/06* | (2006.01) |
| *H01L 21/56* | (2006.01) |

(52) U.S. Cl.
CPC ...... *H01L 23/53209* (2013.01); *H01L 21/565* (2013.01); *H01L 21/67121* (2013.01); *H01L 23/06* (2013.01); *H01L 24/33* (2013.01)

(58) Field of Classification Search
None
See application file for complete search history.

(56) References Cited

U.S. PATENT DOCUMENTS

| 6,359,335 B1* | 3/2002 | Distefano | H01L 21/56 257/684 |
| 8,946,900 B2 | 2/2015 | Qian et al. | |
| 9,640,498 B1 | 5/2017 | Huang et al. | |
| 9,806,058 B2 | 10/2017 | Wei et al. | |
| 2006/0147719 A1* | 7/2006 | Rubinsztajn | C08K 3/22 428/413 |
| 2010/0013076 A1* | 1/2010 | Jang | H01L 21/561 257/687 |
| 2013/0256884 A1 | 10/2013 | Meyer | |
| 2013/0341784 A1* | 12/2013 | Lin | H01L 24/19 257/737 |
| 2014/0091454 A1* | 4/2014 | Lin | H01L 24/19 257/734 |
| 2014/0252655 A1 | 9/2014 | Tran et al. | |
| 2015/0115464 A1* | 4/2015 | Yu | H01L 21/486 257/774 |
| 2015/0115470 A1* | 4/2015 | Su | H01L 24/19 257/774 |

(Continued)

FOREIGN PATENT DOCUMENTS

| TW | 201423851 A | 6/2014 |
| TW | 201424421 A | 7/2017 |
| WO | WO2017143782 A1 | 8/2017 |

*Primary Examiner* — Telly D Green
(74) *Attorney, Agent, or Firm* — Rosenberg, Klein & Lee

(57) ABSTRACT

An embodiment method includes providing a fan-out package structure having cavities to confine semiconductor dies by applying adhesive material which has similar coefficient of thermal expansion (CTE) with semiconductor dies in the gap between the edges of dies and the edges of cavities. The method further includes forming a molding compound over a fan-out package structure with semiconductor dies, building fan-out redistribution layers over a fan-out package structure with semiconductor dies and electrically connected to the semiconductor dies.

13 Claims, 21 Drawing Sheets

(56) References Cited

U.S. PATENT DOCUMENTS

| | | | |
|---|---|---|---|
| 2016/0049376 A1* | 2/2016 | Chen | H01L 21/561 438/106 |
| 2016/0111359 A1* | 4/2016 | Chen | H01L 23/49811 257/738 |
| 2016/0148873 A1* | 5/2016 | Chiang | H01L 23/15 257/774 |
| 2017/0077047 A1* | 3/2017 | Lee | H01L 21/56 |

* cited by examiner

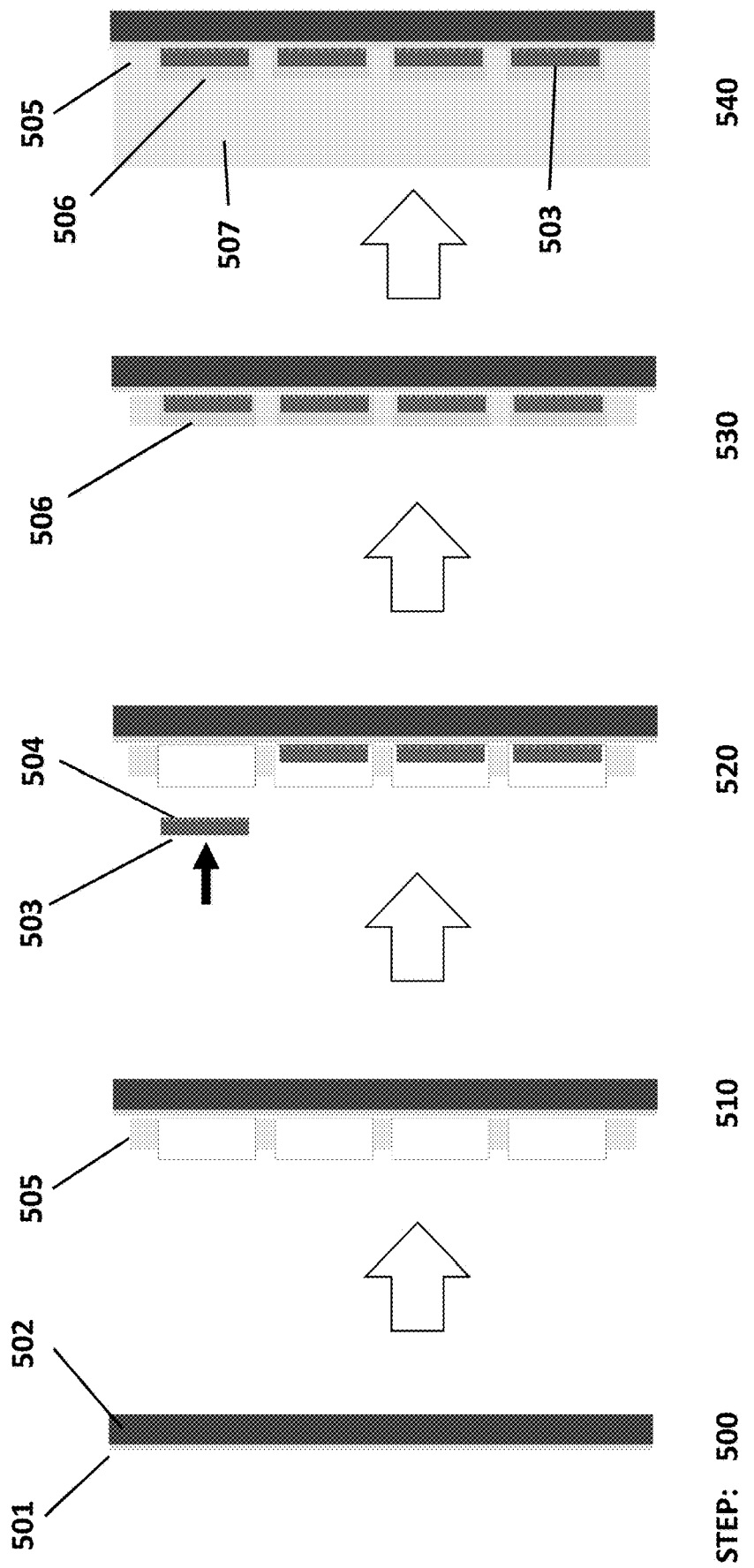

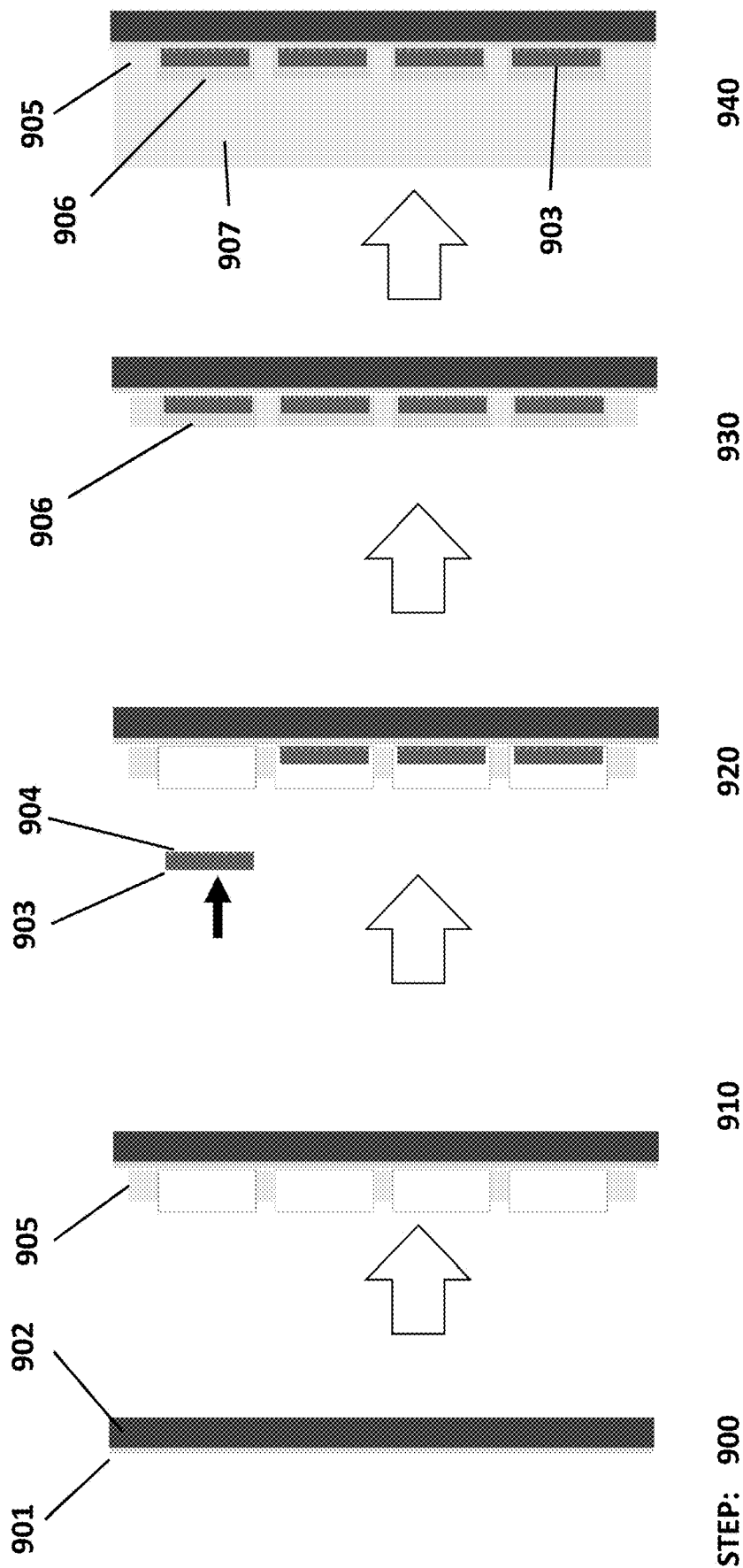

US 10,504,841 B2

SEMICONDUCTOR PACKAGE AND METHOD OF FORMING THE SAME

RELATED APPLICATION

This application claims the priority benefit of U.S. Provisional Application Ser. No. 62/619,834, filed on Jan. 21, 2018, the full disclosure of which is incorporated herein by reference.

BACKGROUND

1. Technical Field

The present disclosure relates to a fan-out package structure and method of improving the current single chip SoC (System On a Chip) application in fan-out package to finer patterning and better manufacturing yield. Moreover, a fan-out package structure and method can integrate multiple dissimilar chips with different functions into a system or subsystem (SiP, System in Package) with thinner package dimension and better electrical performance.

2. Description of the Related Art

Fan-out package is a booming technology to achieve low-cost compact package solution for mobile application (SoC, System On a Chip) and even the high-end computing application (SiP, System in Package). A fan-out package structure is some kind of fixing frame which is made of material having similar coefficient of thermal expansion (CTE) with semiconductor dies such as silicon and glass. A fan-out package structure has cavities formed thereon to confine semiconductor dies therein. Furthermore, a fan-out package structure may have recesses to receive semiconductor dies partially. A fan-out package not only puts everything into a small package to reduce the cost but also shortens the distances of signal paths between chips to enhance the electrical performance and lower power consumption.

The cross sectional view of the examples for single chip and multiple chips application in fan-out package is shown in FIG. 1. Foundry and OSAT manufacturer use wafer level or panel level as the high volume manufacturing (HVM) platform due to the concern of cost and efficiency. There are two major manufacturing methods in fan-out packaging for single chip: Chip-First and Chip-Last. The brief fabrication process of Chip-Last, Chip-First face-up and Chip-First face-down are shown in FIG. 2, FIG. 3 and FIG. 4 separately. Chip-First method can provide thinner package dimension and better performance in electrical resistance than Chip-Last method. The merits attract the high performance computing (HPC) application (SiP, System in Package) to attempt to adopt this fan-out Chip-First method to avoid the high cost of typical 2.5D IC package, such as CoWoS (Chip on Wafer on Substrate), disclosed in U.S. Pat. No. 9,806,058B2 to TSMC or other advanced heterogeneous integration, such as EMIB (Embedded Multi-die Interconnect Bridge), disclosed in U.S. Pat. No. 8,946,900 B2 to INTEL. But current single chip fan-out Chip-First packaging high volume manufacturing (HVM) platform cannot apply to the manufacturing of multiple chips (SiP, System in Package) integration.

Referring to FIG. 1, which is a cross-sectional view of a typical example for single die 101 and multiple dies (thin die 102, thicker die 103, and stacking die 104) in a fan-out package. Single die 101 or multiple dies (thin die 102, thicker die 103, and stacking die 104) is embedded in the wrap of epoxy molding compound (EMC) 110 and connects thin-film redistribution layers (RDLs) 120 with metal pads 130. On the other side of thin-film redistribution layers (RDLs) 120 are placed with solder balls 140.

FIG. 2 illustrates the brief fabrication process flow of a typical single Chip-Last fan-out package. In STEP 210, thin-film redistribution layers (RDLs) 201 are formed on to a glass carrier 202 which may be in wafer or panel form. In STEP 220, known good dies (KGDs) 203 are picked and attached to the top of the thin-film redistribution layers (RDLs) 201 by a chip bonding process with precise alignment accordingly. In STEP 230, an epoxy molding compound (EMC) 205 is applied over the dies 203 and thin-film redistribution layers (RDLs) 201 by a wafer/panel overmolding process. In STEP 240, the glass carrier 202 is removed from the package formed in STEP 230. In STEP 250, solder balls 206 are placed on to the UBM pads of the thin-film redistribution layers (RDLs) 201.

FIG. 3 illustrates the brief fabrication process flow of a typical single Chip-First face-up fan-out package. In STEP 310, known good dies (KGDs) 302 are picked and attached to the top of a thermal release film 303 of a glass carrier 304 which may be in wafer/panel form by a chip bonding process with precise alignment accordingly. In STEP 320, an epoxy molding compound (EMC) 305 is applied to over the dies 302 and the thermal release film 303 by a wafer/panel overmolding process. In STEP 330, the epoxy molding compound (EMC) 305 is back-grinded to expose metal pads 301 out from the surface of the epoxy molding compound (EMC) 305. In STEP 340, thin-film redistribution layers (RDLs) 306 are formed and solder balls 307 are then placed on the top of the dies 302. In STEP 350, the thermal release film 303 with the glass carrier 304 is removed from the package formed in STEP 340.

FIG. 4 illustrates the brief fabrication process flow of single Chip-First face-down fan-out package. In STEP 410, known good dies (KGDs) 402 are picked and attached to the top of a thermal release film 403 of a glass carrier 404 which may be in wafer/panel form, by a chip wafer/panel bonding process with precise alignment accordingly. In STEP 420, an epoxy molding compound (EMC) 405 is applied over the dies 402 and the thermal release film 403 by a wafer/panel overmolding process. In STEP 430, the thermal release film 403 with the glass carrier 404 is removed from the package formed in STEP 420. In STEP 440, thin-film redistribution layers (RDLs) 406 are formed and solder balls 407 are then placed on the thin-film redistribution layers (RDLs) 406.

The manufacturing challenges of current Chip-First package mainly come from the compression molding process. Wafer/Panel level compression molding is one of the main fan-out manufacturing processes to build the reconfigured wafer/panel that precedes the thin-film redistribution layers (RDLs) processes. The epoxy molding compound (EMC) is used for fan-out interconnection fabrication, and the protection barrier against corrosive or humid environments. The accurate location of the die is required for high yield of the fine resolution thin-film redistribution layers (RDLs) process. A critical die dislocation issue during the molding process reduces the yield. The die shifting away from its original positions is normally observed during embedding. This situation will be getting more serious when transiting to the larger wafer/panel size. Significant misalignments will be caused due to the tiny die dislocation offset in the lithography process. The thin-film redistribution layer (RDL) spacing requirement and device pad pitch are also impacted seriously. Therefore, the more demand of reducing package dimension has the more production yield is lost.

Three major factors that cause the die dislocation during the molding process are listed as below:
1. The coefficient of thermal expansion (CTE) mismatch of involved materials, such as dies, thin-film redistribution layers (RDLs) and epoxy molding compound (EMC) during temperature variation in the fabrication process;
2. The drag force from the mold flow during filling/compressing process; and
3. The epoxy molding compound (EMC) chemical shrinkage during multiple cure process of building thin-film redistribution layers (RDLs).

There are some methods that attempt to improve the die dislocation during the single chip fan-out manufacturing processes, such as the embedded silicon carrier disclosed in WO 2017143782 A1 to Hua-Tian Technology (Kunshan) Electronics Co., Ltd, and the patterned carrier disclosed in U.S. Pat. No. 9,640,498 B1 to TSMC. But those above methods are not fully coverage of the above factors but also cannot handle the manufacturing of the multiple dies heterogeneous integration in a fan-out package. Normally heterogeneous integration is composed of dies without same dimension and height. In order to resolve the above problems, Maxim Integrated Products, Inc. provides a heterogeneous integration solution in silicon carrier which disclosed in US 2014/0252655 A1. But this high cost and proprietary manufacturing method cannot meet the high volume manufacturing (HVM) efficiency and cost of foundry and OSTA manufacturer expected. Moreover, this method still cannot provide better solution to improve the electrical performance and less power consumption.

SUMMARY

An object of the present disclosure is to provide a semiconductor package and method of forming the same that is capable of avoiding dies (single-chip and multiple-chips) dislocation during the compression molding process of fan-out package manufacturing process. The semiconductor package and method of forming the same is capable of matching the original wafer level or panel level high volume manufacturing (HVM) platform of fan-out package manufacturing with better fabrication yield.

Another object of present disclosure is to provide a semiconductor package and method of forming the same that may enhance the finer features of thin-film redistribution layers (RDLs) by reducing the expose of epoxy molding compound (EMC) on the thin-film redistribution layers (RDLs) side of fan-out package manufacturing.

The last object of present disclosure is to provide a semiconductor package and method of forming the same that may integrate multiple dies in one package (SiP, System in Package) with more compact package dimension and better electrical performance interconnections.

In order to achieve the above objects, the semiconductor package and method of forming the same according to the present disclosure includes a fan-out package structure which has cavities formed thereon to confine semiconductor dies therein by filling the gaps between the edge of the dies and the edge of the cavities with adhesive that has similar coefficient of thermal expansion (CTE) with semiconductor dies. The adhesive may be composed of and mixed with glass powder, filler, binder and some additives. The adhesive may be low coefficient of thermal expansion (CTE) epoxy. The adhesive has similar and as close as the coefficient of thermal expansion (CTE) with semiconductor device chips/dies. The coefficient of thermal expansion (CTE) of the adhesive may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive may not generate gas during the following thermal process. After heating and hardening the adhesive, the fan-out package structure with semiconductor dies according to the present disclosure will be jointed as firmly as one complete object such as wafer, panel, substrate or single die and has uniform thermal expansion during various processes (e.g., molding or building thin-film redistribution layers, RDLs).

The semiconductor package according to the present disclosure includes a fan-out package structure that may have recesses to receive semiconductor dies partially. The dies partially disposed in the recesses may be attached on the recesses with the above-mentioned adhesive or solder joint in between. The fan-out package structure in the semiconductor package of the present disclosure may have through holes/vias to hold or contain the metal pillars or poles that interconnect the thin-film redistribution layers (RDLs) and semiconductor dies on the recesses electrically.

The fan-out package structure in the semiconductor package of the present disclosure may be in wafer, panel, substrate or single die form. The size of the cavities inside a fan-out package structure may be different and copes with the size of individual semiconductor die placed inside the cavity. After heating and hardening the adhesive, the fan-out package structure with semiconductor dies according to the present disclosure will be jointed as firmly as one complete object such as wafer, panel, substrate or single die. The complete object has high CTE uniformity and is easy to handle (e.g., moving, flipping and doing alignment) during various processes (e.g., molding or building thin-film redistribution layers, RDLs).

After various features of the fan-out package are formed, the fan-out package structure with will be included in the semiconductor package. The top surface of the fan-out package structure may have some alignment marks to improve the device dies placement precisely during the pick and place process.

Therefore, the semiconductor package with a fan-out package structure according to the present disclosure has at least the following advantages:
1. The fan-out package structure confines the semiconductor dies firmly by using the adhesive which has similar coefficient of thermal expansion (CTE) with semiconductor dies to avoid the dies dislocation (such as dies shifting and protrusion) during the compression molding process. Therefore, the fan-out package structure improves the manufacturing yield of fan-out package manufacturing process.
2. The fan-out package structure confines the semiconductor dies with the adhesive firmly and reduces the expose of epoxy molding compound (EMC) on the thin-film redistribution layers (RDLs) side of the fan-out package. Therefore, the fan-out package structure and method according to the present disclosure may improve the topology of surface on the thin-film redistribution layers (RDLs) side and extent to finer features of thin-film redistribution layers (RDLs).
3. The fan-out package structure not only shortens the electrical signal path but also reduces the solder joints or solder in the electrical signal path. Therefore, the fan-out package structure may provide multiple dies integrated in one fan-out package with better electrical performance interconnections and less thermal consumption. Moreover, the fan-out package structure shortens the electrical signal path and also reduces the package dimension.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5-1 and FIG. 5-2 are schematic diagrams illustrating the single Chip-First face-down fan-out package process flow using a fan-out package structure and method according to the present disclosure.

FIG. 6-1 and FIG. 6-2 are schematic diagrams illustrating the single Chip-First face-up fan-out package process flow using the fan-out package structure and method according to the present disclosure.

FIG. 7-1 and FIG. 7-2 are schematic diagrams illustrating the multiple Chips-First face-down fan-out package process flow using the fan-out package structure and method according to the present disclosure.

FIG. 8-1 and FIG. 8-2 are schematic diagrams illustrating the multiple Chips-First face-up fan-out package process flow using the fan-out package structure and method according to the present disclosure.

FIG. 9-1 and FIG. 9-2 are schematic diagrams illustrating the single Chip-Last fan-out package process flow using the fan-out package structure and method according to the present disclosure.

FIG. 10-1 and FIG. 10-2 are schematic diagrams illustrating the multiple Chip-Last fan-out package process flow using the fan-out package structure and method according to the present disclosure.

FIG. 12-1 and FIG. 12-2 are block and cross-sectional views respectively to illustrate the example of single Chip-First fan-out package with a fan-out package structure in wafer form according to the present disclosure.

FIG. 13-1 and FIG. 13-2 are block and cross-sectional views respective to illustrate the example of multiple Chips-First fan-out package with a fan-out package structure in wafer according to the present disclosure.

DETAILED DESCRIPTION OF THE PREFERRED EMBODIMENT

Figure 1:
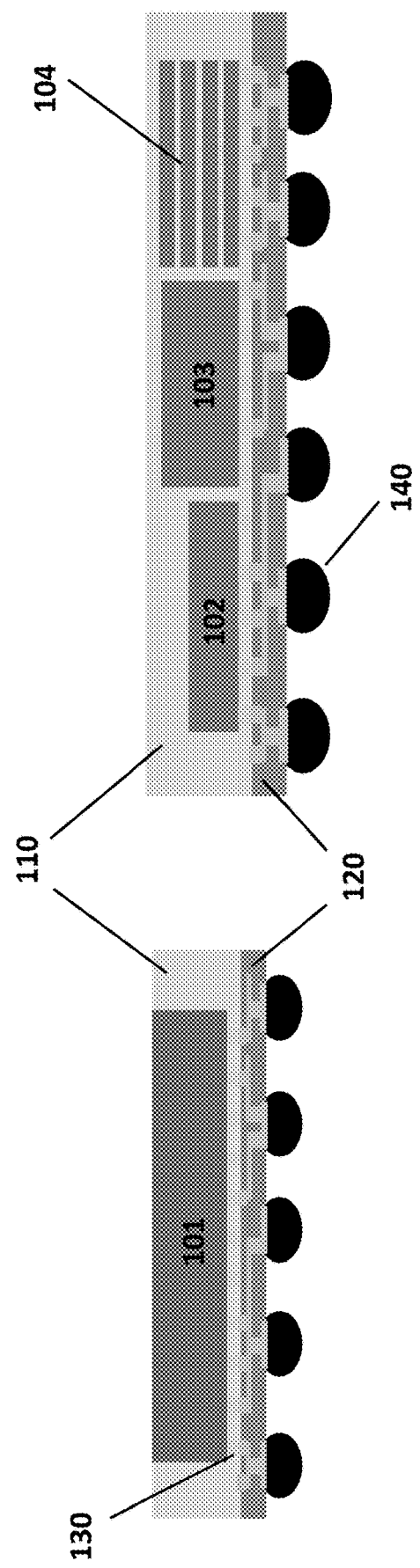
FIG. 1 is a cross-sectional view illustrating a typical example of single chip and multiple chips application in fan-out package.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatial relative terms, such as "beneath." "below," "lower," "above," "upper" and the like, may be used herein for ease of description to describe one element or feature's relationship to another element(s) or feature(s) as illustrated in the figures. The spatial relative terms are intended to encompass different orientations of the device in use or operation in addition to the orientation depicted in the figures. The apparatus may be otherwise oriented (rotated 90 degrees or at other orientations) and the spatial relative descriptors used herein may likewise be interpreted accordingly.

Figure 2:
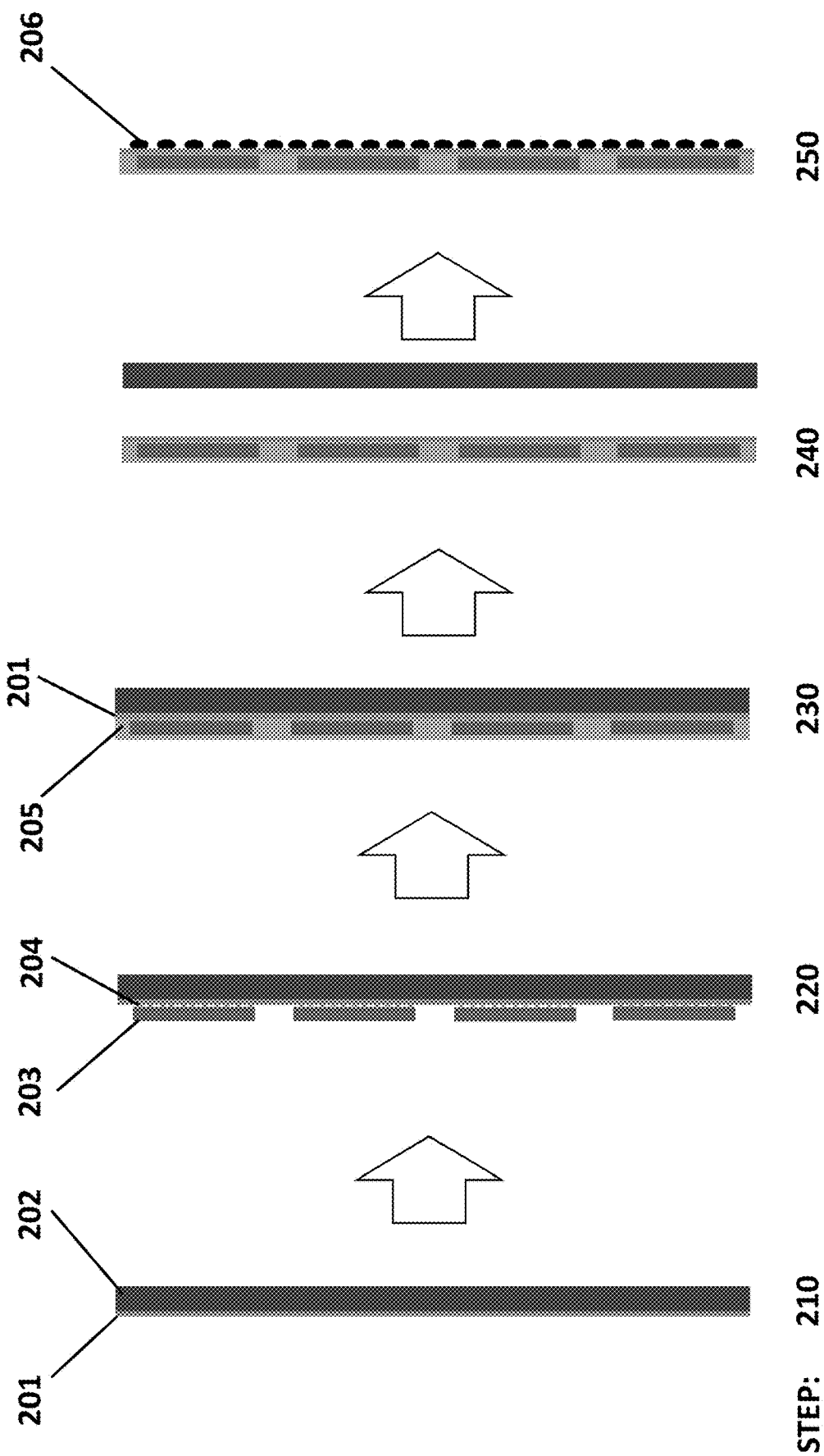
FIG. 2 is a schematic diagram illustrating the brief fabrication process flow of a typical single Chip-Last fan-out package.
Figure 3:
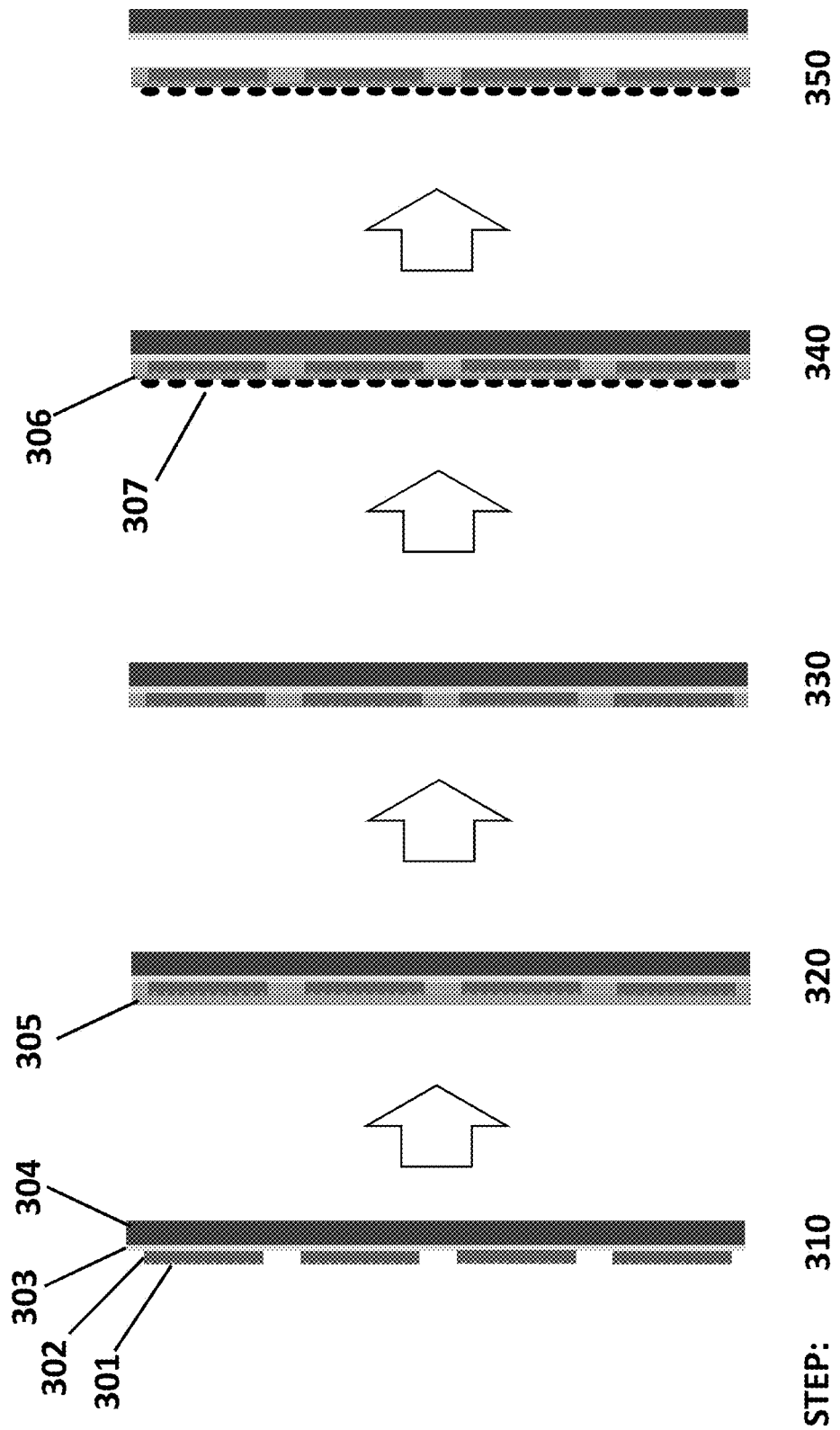
FIG. 3 is a schematic diagram illustrating the brief fabrication process flow of a typical single Chip-First face-up fan-out package.
Figure 4:
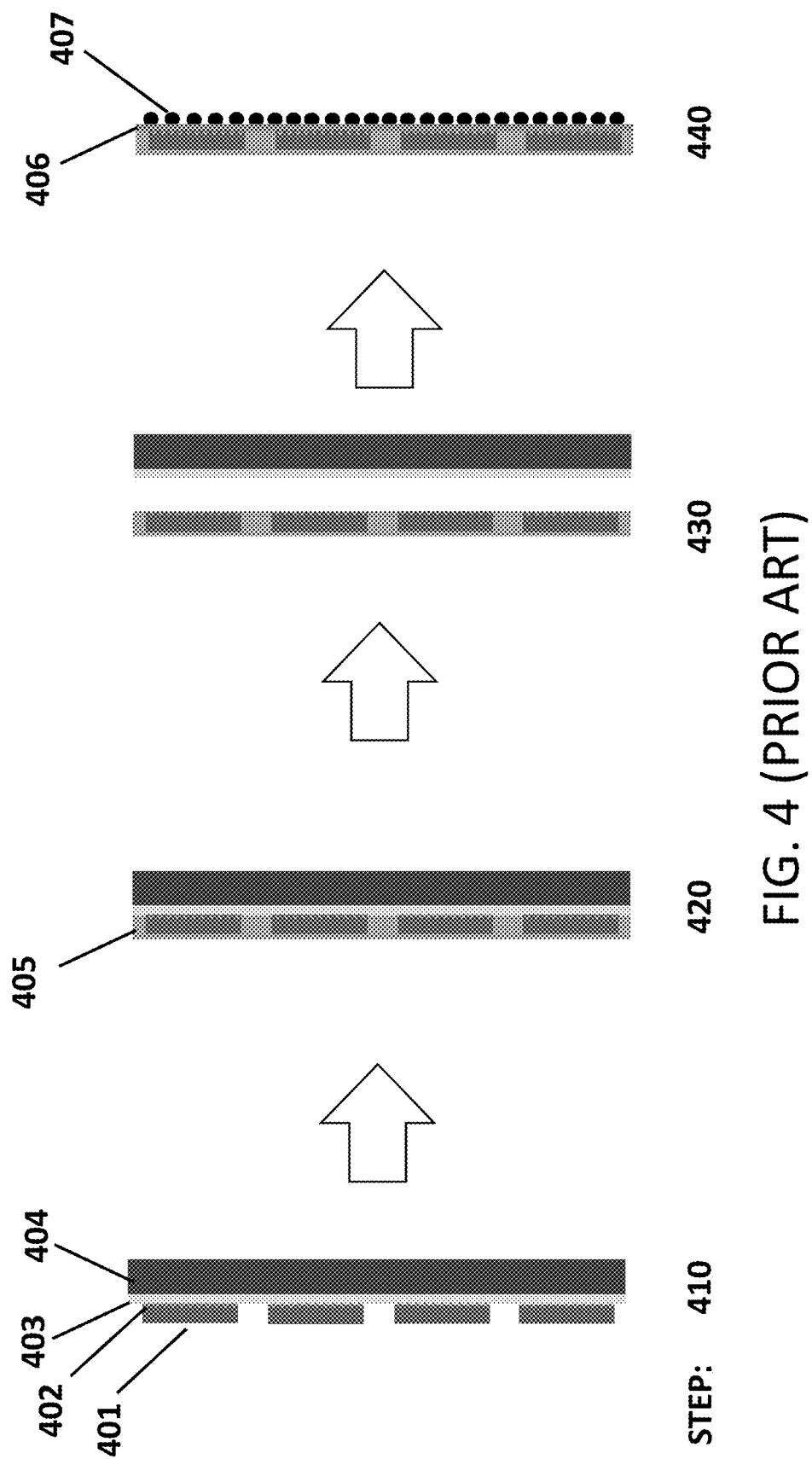
FIG. 4 is a schematic diagram illustrating the brief fabrication process flow of a typical single Chip-First face-down fan-out package.
Figures 2, 5:
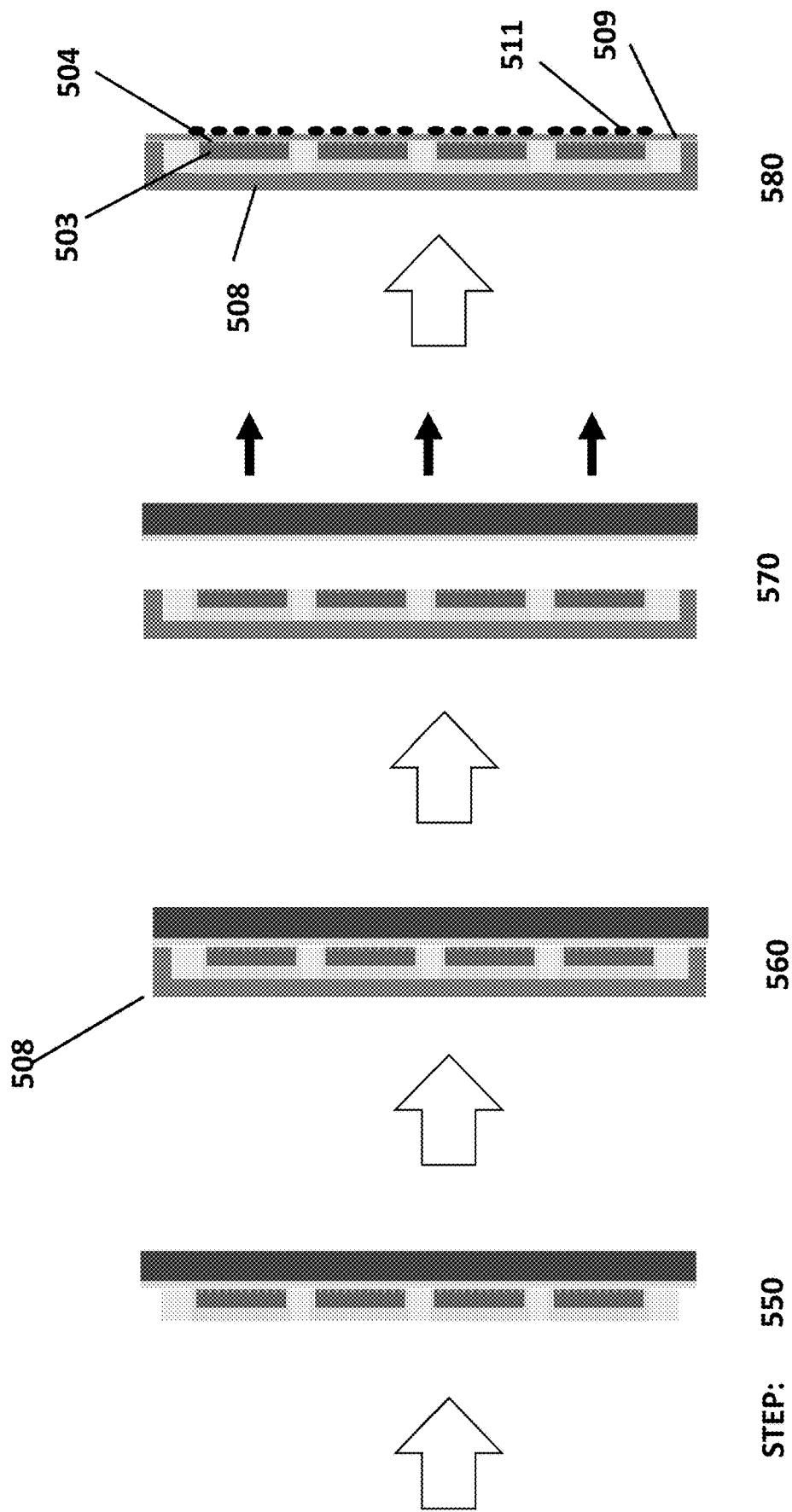

FIG. 5-1 and FIG. 5-2 illustrate the single Chip-First face-down fan-out package process flow using the fan-out package structure and method according to the present disclosure. In STEP 500, an adhesive film 501 is applied on a carrier 502 which may be in wafer or panel form. In STEP 510, a fan-out package structure 505 is placed on the top surface of the adhesive film 501 on the carrier 502 accordingly. In STEP 520, known good dies (KGDs) 503 each having metal pads 504 formed thereon are picked and placed into corresponding cavities formed on the fan-out package structure 505 precisely such that the metal pads 504 of the dies 503 are positioned to face the carrier 502. In this embodiment, each of the cavities is provided to receive only one of the dies 503. In STEP 530, an adhesive 506 that has similar coefficient of thermal expansion (CTE) with the dies 503 is filled in the cavities to surround the dies 503. In STEP 540, the adhesive 506 is heated with hot atmosphere 507 so that the adhesive 506 filled in the cavities is hardened to fix and confine the dies 503. Therefore, a package including the fan-out package structure 505 and the dies 503 surrounded by the hardened adhesives 506 is formed and attached to the carrier 502 by the adhesive film 501. In STEP 550, the package including the fan-out package structure 505 with the dies 503 is disposed on the top of the adhesive film 501 on the carrier 502 after cooling down. In STEP 560, an epoxy molding compound (EMC) 508 is formed over the fan-out package structure 505 and the adhesive film 501 and around the dies 503 by a wafer/panel overmolding process. In STEP 570, the adhesive film 501 and the carrier 502 are removed from the package formed in STEP 560. In STEP 580, thin-film redistribution layers (RDLs) 509 are formed to electrically connect the metal pads 504 and solder balls 511 are then placed on the thin-film redistribution layers (RDLs) 509. Therefore, a semiconductor package including the dies 503 covered by the thin-film redistribution layers (RDLs) 509, the epoxy molding compound (EMC) 508 and the solder balls 511 disposed on the thin-film redistribution layers (RDLs) 509 is finally formed.

The adhesive 506 may be an epoxy adhesive or be composed of and mixed with glass powder, filler, binder and some additives. The adhesive 506 may be low coefficient of thermal expansion (CTE) epoxy. The adhesive 506 has similar and as close as the coefficient of thermal expansion (CTE) with the dies 503. The coefficient of thermal expansion (CTE) of the adhesive 506 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 506 may not generate gas during the following thermal process. After heating and hardening the adhesive 506, the fan-out package structure 505 with the dies 503 will be jointed as firmly as one complete object and has uniform thermal expansion during various processes.

Figures 1, 6:
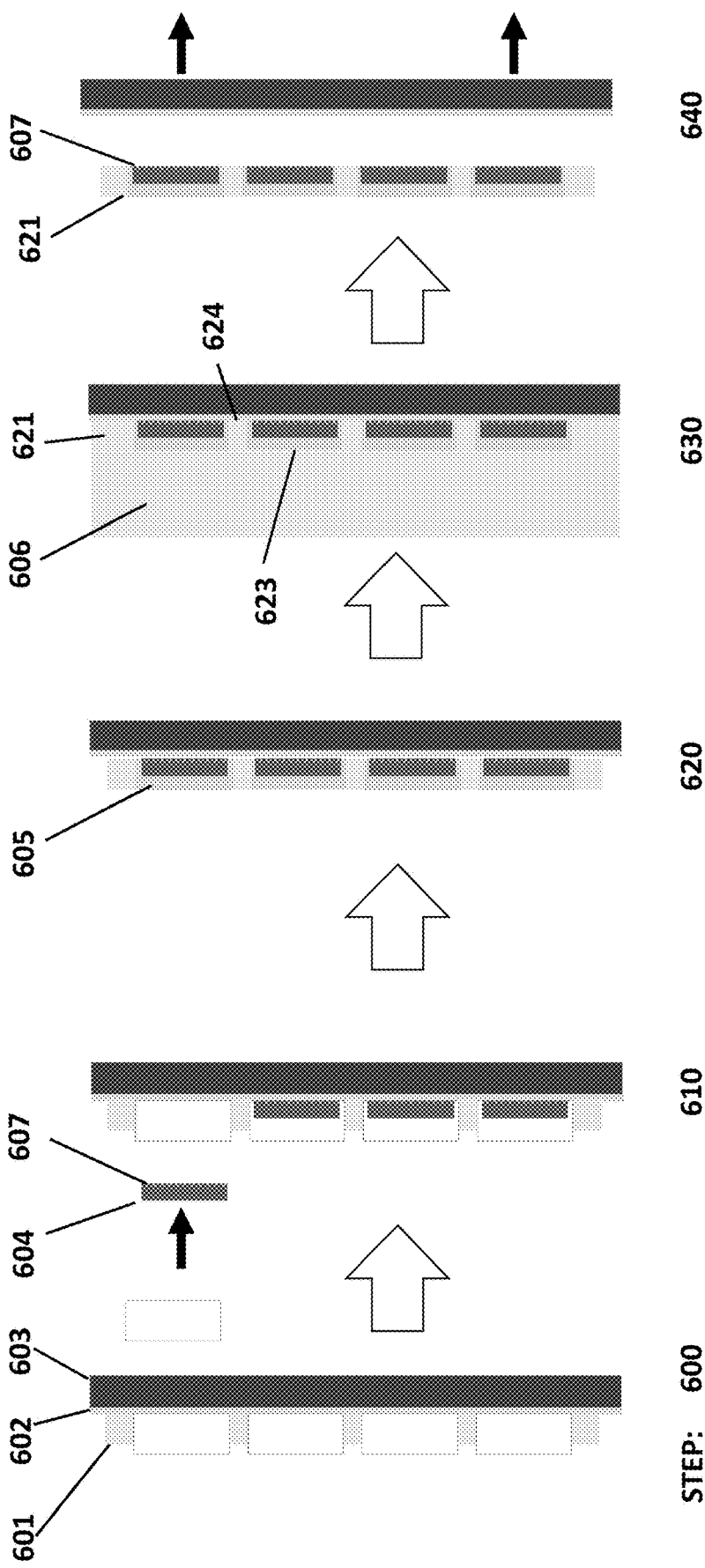
Figures 2, 6:
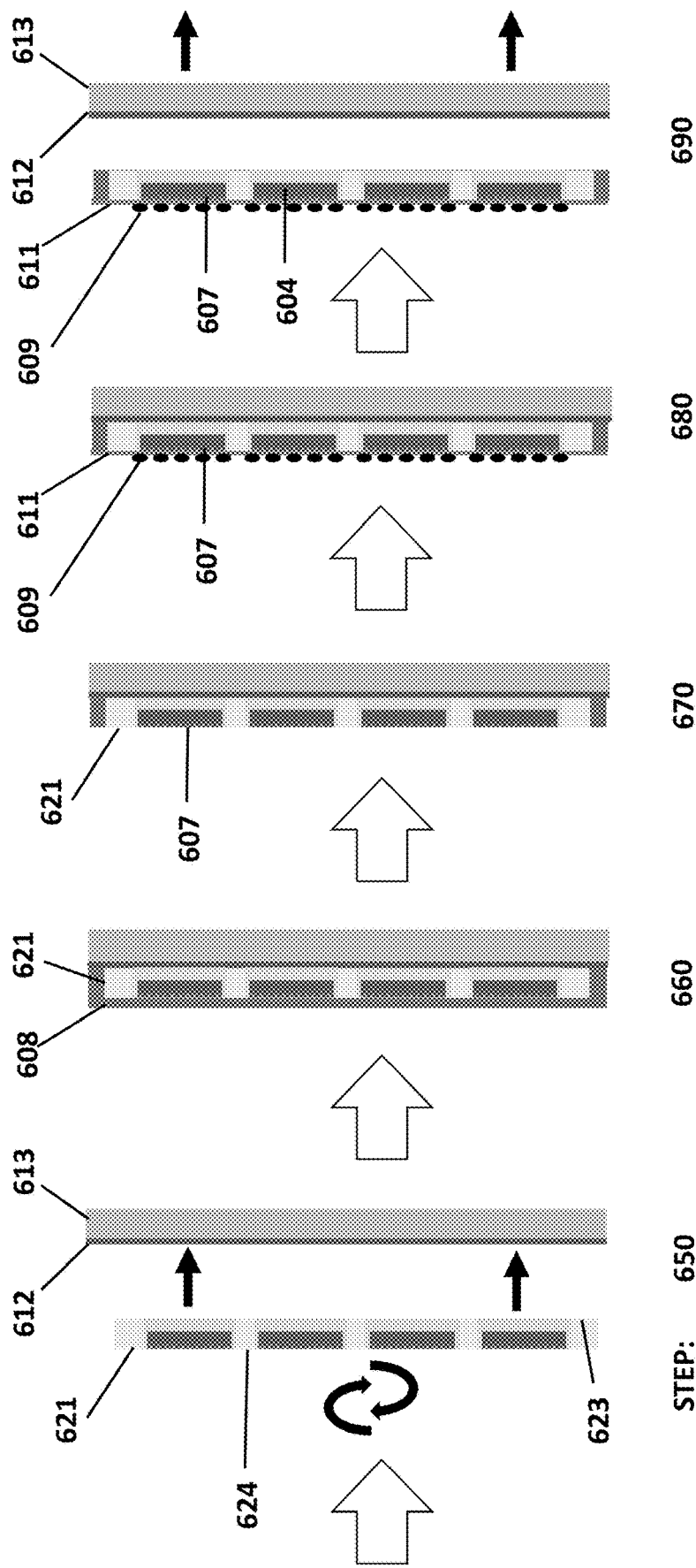

FIG. 6-1 and FIG. 6-2 illustrate the single Chip-First face-up fan-out package process flow using the fan-out package structure and method according to the present disclosure. In STEP 600, an adhesive film 602 is applied on a carrier 603 which may be in wafer or panel form and a fan-out package structure 601 is placed on the top surface of the adhesive film 602 on the carrier 603 accordingly. In STEP 610, known good dies (KGDs) 604 each having metal pads 607 formed thereon are picked and placed into corresponding cavities formed on the fan-out package structure 601 precisely such that the metal pads 607 of the dies 604 are positioned to face the carrier 603. In this embodiment, each of the cavities is provided to receive only one of the dies 604. In STEP 620, an adhesive 605 that has similar coefficient of thermal expansion (CTE) with the dies 604 is filled in the cavities to surround the dies 604. In STEP 630, the adhesive 605 is heated with hot atmosphere 606 so that the adhesive 605 filled in the cavities is hardened to fix and confine the dies 604. Therefore, a package 621 including the fan-out package structure 601 and the dies 604 surrounded by the hardened adhesives 605 is formed and attached to the carrier 603 by the adhesive film 602. The package 621 has opposing first surface 623 and second surface 624, wherein the second surface 624 is attached to the carrier 603 by the adhesive film 602. In STEP 640, the adhesive film 602 and the carrier 603 are removed from the package 621 formed in STEP 630. In STEP 650, the package 621 formed in STEP 640 is flipped over and placed on to the top of an adhesive film 612 formed on a carrier 613 so that the first surface 623 of the package 621 is attached to the carrier 613 by the adhesive film 612. In STEP 660, an epoxy molding compound (EMC) 608 is formed over the package 621 by a wafer/panel overmolding process. In STEP 670, the epoxy molding compound (EMC) 608 is back-grinded to remove a portion of the epoxy molding compound (EMC) 608 so as to expose the metal pads 607 of the dies 604 out from the surface of the epoxy molding compound (EMC) 608. In STEP 680, thin-film redistribution layers (RDLs) 611 are formed to electrically connect the metal pads 607 and solder balls 609 are then placed on the thin-film redistribution layers (RDLs) 611. In STEP 690, the adhesive film 612 and the carrier 613 are removed from the package formed in STEP 680. Therefore, a semiconductor package including the dies 604 covered by the thin-film redistribution layers (RDLs) 611, the epoxy molding compound (EMC) 608 and the solder balls 609 disposed on the thin-film redistribution layers (RDLs) 611 is finally formed.

The adhesive 605 may be an epoxy adhesive or be composed of and mixed with glass powder, filler, binder and some additives. The adhesive 605 may be low coefficient of thermal expansion (CTE) epoxy. The adhesive 605 has similar and as close as the coefficient of thermal expansion (CTE) with the dies 604. The coefficient of thermal expansion (CTE) of the adhesive 605 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 605 may not generate gas during the following thermal process. After heating and hardening the adhesive 605, the fan-out package structure 601 with the dies 604 will be jointed as firmly as one complete object and has uniform thermal expansion during various processes.

Figures 1, 7:
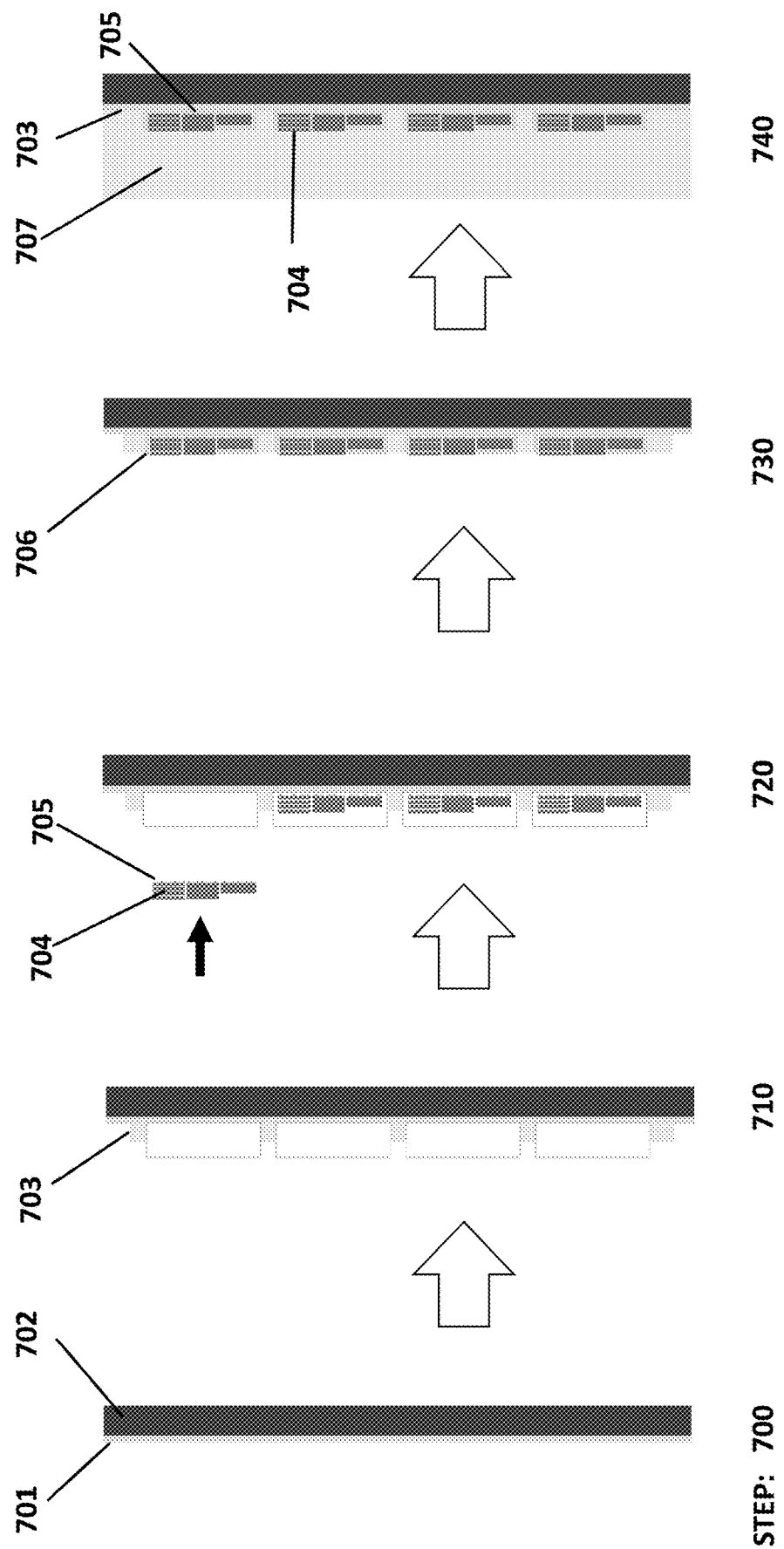
Figures 2, 7:
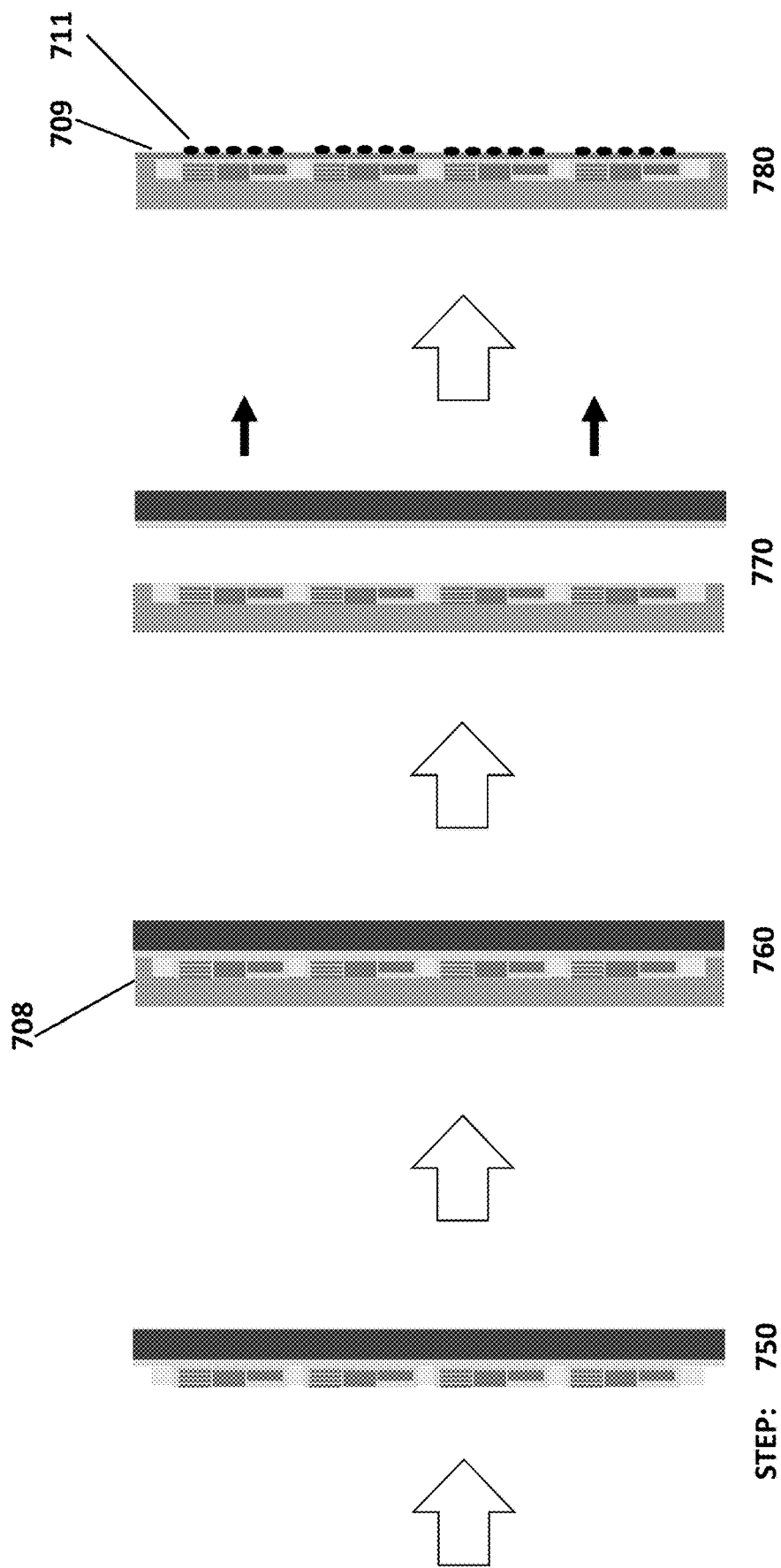

FIG. 7-1 and FIG. 7-2 illustrate the multiple Chips-First face-down fan-out package process flow using the fan-out package structure and method according to the present disclosure. In STEP 700, an adhesive film 701 is applied on a carrier 702. In STEP 710, a fan-out package structure 703 is placed on the top surface of the adhesive film 701 on the carrier 702 accordingly. In STEP 720, known good dies (KGDs) 704, such as thin die, thicker die, and/or stacking dies each having metal pads 705 formed thereon are picked and placed into corresponding cavities formed on the fan-out package structure 703 precisely such that the metal pads 705 of the dies 704 are positioned to face the carrier 702. In STEP 730, an adhesive 706 that has similar coefficient of thermal expansion (CTE) with the dies 704 is filled in the cavities to surround the dies 704. In STEP 740, the adhesive 706 is heated with hot atmosphere 707 so that the adhesive 706 filled in the cavities is hardened to fix and confine the dies 704. Therefore, a package including the fan-out package structure 703 and the dies 704 surrounded by the hardened adhesives 706 is formed and attached to the carrier 702 by the adhesive film 701. In STEP 750, the package including the fan-out package structure 703 with the dies 704 is disposed on the top of the adhesive film 701 on the carrier 702 after cooling down. In STEP 760, an epoxy molding compound (EMC) 708 is formed over the fan-out package structure 703 and the adhesive film 701 and around the dies 704 by a wafer/panel overmolding process. In STEP 770, the adhesive film 701 and the carrier 702 are removed from the package formed in STEP 760. In STEP 780, thin-film redistribution layers (RDLs) 709 are formed to electrically connect the metal pads 705 and solder balls 711 are then placed on the thin-film redistribution layers (RDLs) 709. Therefore, a semiconductor package including the dies 704 covered by the thin-film redistribution layers (RDLs) 709, the epoxy molding compound (EMC) 708 and the solder balls 711 disposed on the thin-film redistribution layers (RDLs) 709 is finally formed.

The adhesive 706 may be an epoxy adhesive or be composed of and mixed with glass powder, filler, binder and some additives. The adhesive 706 may be low coefficient of thermal expansion (CTE) epoxy. The adhesive 706 has similar and as close as the coefficient of thermal expansion (CTE) with the dies 704. The coefficient of thermal expansion (CTE) of the adhesive 706 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 706 may not generate gas during the following thermal process. After heating and hardening the adhesive 706, the fan-out package structure 703 with the dies 704 will be jointed as firmly as one complete object and has uniform thermal expansion during various processes.

Figures 1, 8:
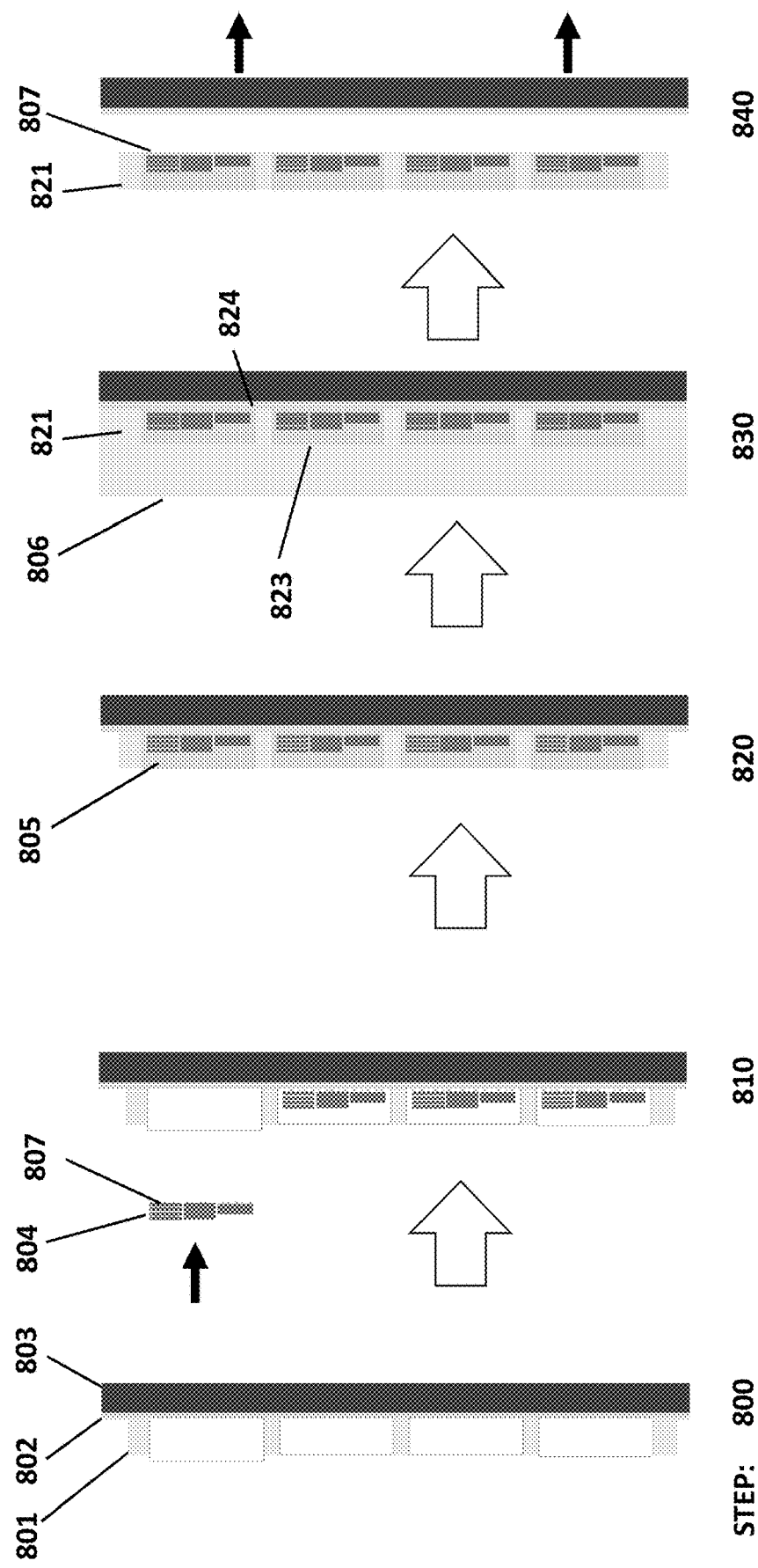
Figures 2, 8:
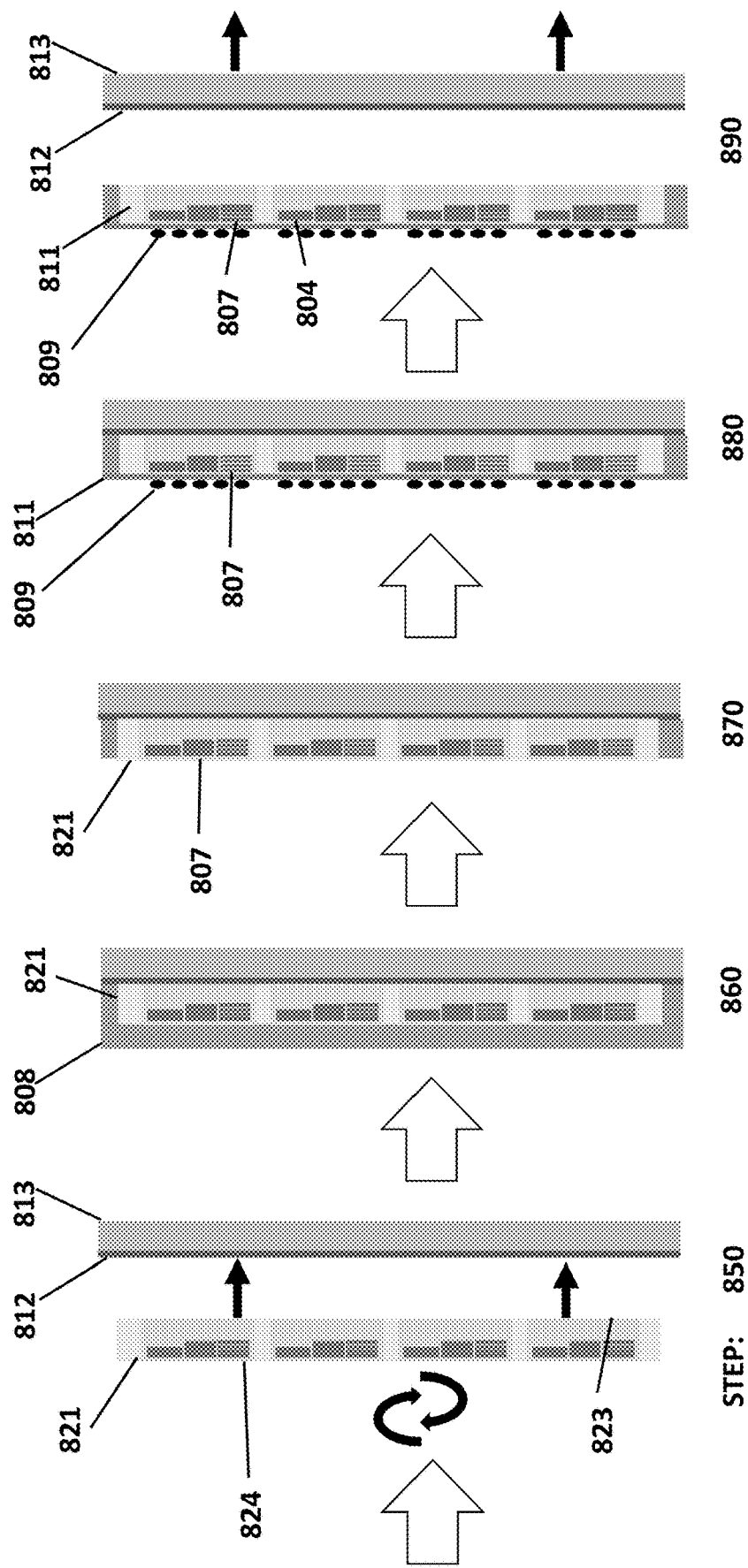

FIG. 8-1 and FIG. 8-2 illustrate the multiple Chips-First face-up fan-out package process flow using the fan-out package structure and method according to the present disclosure. In STEP 800, an adhesive film 802 is applied on a carrier 803 which may be in wafer or panel form and a fan-out package structure 801 is placed on the top surface of the adhesive film 802 on the carrier 803 accordingly. In STEP 810, known good dies (KGDs) 804, such as thin die, thicker die and/or stacking dies each having metal pads 807 formed thereon are picked and placed into corresponding cavities formed on the fan-out package structure 801 precisely such that the metal pads 807 of the dies 804 are positioned to face the carrier 803. In STEP 820, an adhesive 805 that has similar coefficient of thermal expansion (CTE) with the dies 804 is filled in the cavities to surround the dies 804. In STEP 830, the adhesive 805 is heated with hot atmosphere 806 so that the adhesive 805 filled in the cavities is hardened to fix and confine the dies 804. Therefore, a package 821 including the fan-out package structure 801 and the dies 804 surrounded by the hardened adhesives 805 is formed and attached to the carrier 803 by the adhesive film 802. The package 821 has opposing first surface 823 and second surface 824, wherein the second surface 824 is attached to the carrier 803 by the adhesive film 802. In STEP 840, the adhesive film 802 and the carrier 803 are removed from the package 821 formed in STEP 830. In STEP 850, the package 821 formed in STEP 840 is flipped over and placed on to the top of an adhesive film 812 formed on a carrier 813 so that the first surface 823 of the package 821 is attached to the carrier 813 by the adhesive film 812. In STEP 860, an epoxy molding compound (EMC) 808 is formed over the package 821 by a wafer/panel overmolding process. In STEP 870, the epoxy molding compound (EMC) 808 is back-grinded to remove a portion of the epoxy molding compound 808 so as to expose the metal pads 807 of the dies 804 out from the surface of the epoxy molding compound (EMC) 808. In STEP 880, thin-film redistribution layers (RDLs) 811 are formed to electrically connect the metal pads 807 and solder balls 809 are then placed on the thin-film redistribution layers (RDLs) 811. In STEP 890, the adhesive film 812 and the carrier 813 are removed from the package formed in STEP 880. Therefore, a semiconductor package including the dies 804 covered by the thin-film redistribution layers (RDLs) 811, the epoxy molding compound (EMC) 808 and the solder balls 809 disposed on the thin-film redistribution layers (RDLs) 811 is finally formed.

The adhesive 805 may be an epoxy adhesive or be composed of and mixed with glass powder, filler, binder and some additives. The adhesive 805 may be low coefficient of thermal expansion (CTE) epoxy. The adhesive 805 has similar and as close as the coefficient of thermal expansion (CTE) with the dies 804. The coefficient of thermal expansion (CTE) of the adhesive 805 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 805 may not generate gas during the following thermal process. After heating and hardening the adhesive 805, the fan-out package structure 801 with the dies 804 will be jointed as firmly as one complete object and has uniform thermal expansion during various processes.

Figures 2, 9:
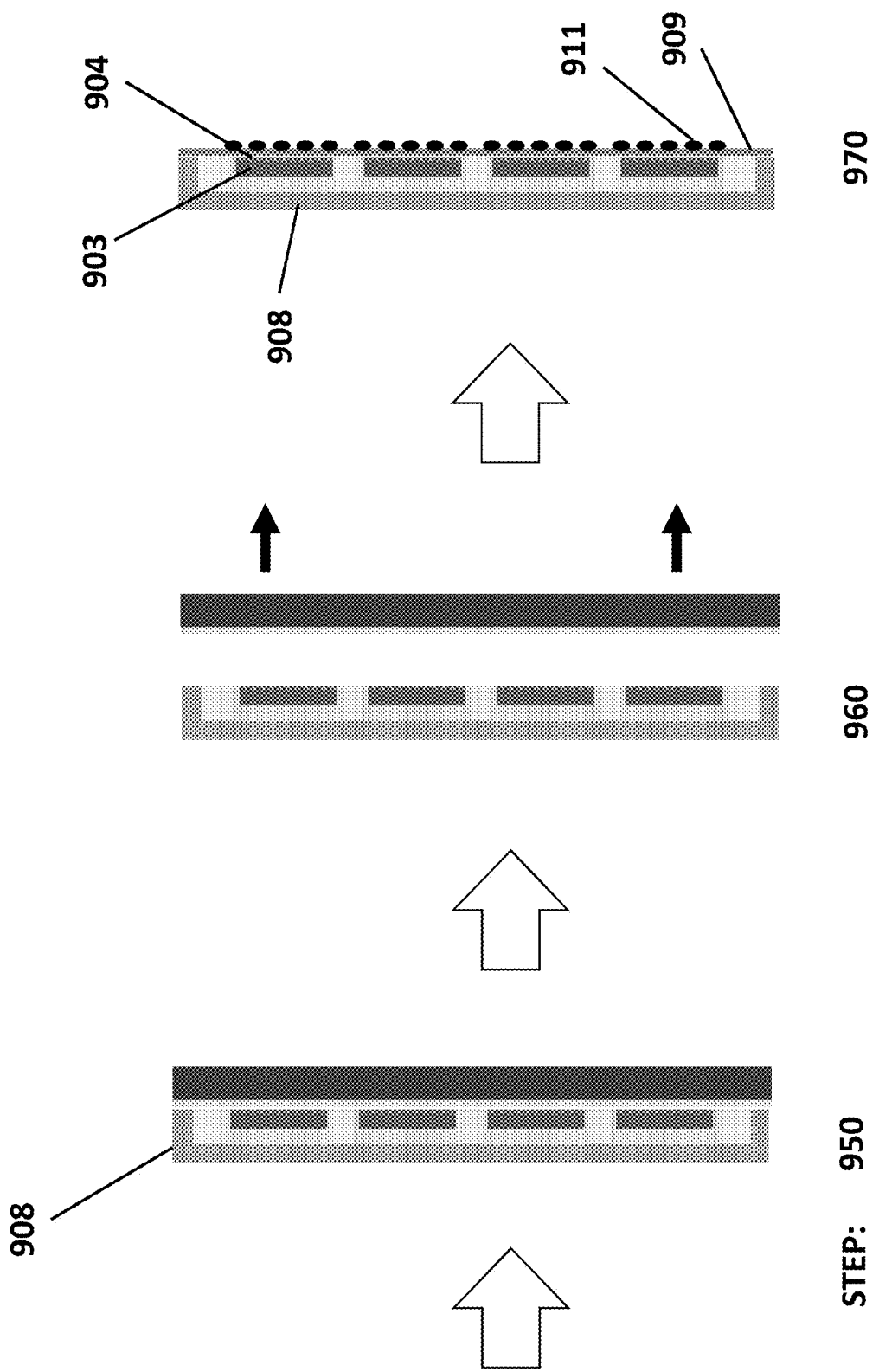

FIG. 9-1 and FIG. 9-2 illustrate the single Chip-Last fan-out package process flow using the fan-out package structure and method according to the present disclosure. In STEP 900, an adhesive film 901 is applied on a carrier 902. In STEP 910, a fan-out package structure 905 is placed on the top surface of the adhesive film 901 on the carrier 902 accordingly. In STEP 920, known good dies (KGDs) 903 each having metal pads 904 formed thereon are picked and placed into corresponding cavities formed on the fan-out package structure 905 precisely such that the metal pads 904 of the dies 903 are positioned to face the carrier 902. In this embodiment, each of the cavities is provided to receive only one of the dies 903. In STEP 930, an adhesive 906 that has similar coefficient of thermal expansion (CTE) with the dies 903 is filled in the cavities to surround the dies 903. In STEP 940, the adhesive 906 is heated with hot atmosphere 907 so that the adhesive 906 filled in the cavities is hardened to fix and confine the dies 903. Therefore, a package including the fan-out package structure 905 and the dies 903 surrounded by the hardened adhesives 906 is formed and attached to the carrier 902 by the adhesive film 901. In STEP 950, an epoxy molding compound (EMC) 908 is formed over the fan-out package structure 905 and the adhesive film 901 and around the dies 903 by a wafer/panel overmolding process. In STEP 960, the adhesive film 901 and the carrier 902 are removed from the package formed in STEP 950. In STEP 970, thin-film redistribution layers (RDLs) 909 are formed to electrically connect the metal pads 904 and solder balls 911 are then placed on the thin-film redistribution layers (RDLs) 909. Therefore, a semiconductor package including the dies 903 covered by the thin-film redistribution layers (RDLs) 909, the epoxy molding compound (EMC) 908 and the solder balls 911 disposed on the thin-film redistribution layers (RDLs) 909 is finally formed.

The adhesive 906 may be an epoxy adhesive or be composed of and mixed with glass powder, filler, binder and some additives. The adhesive 906 may be low coefficient of thermal expansion (CTE) epoxy. The adhesive 906 has similar and as close as the coefficient of thermal expansion (CTE) with the dies 903. The coefficient of thermal expansion (CTE) of the adhesive 906 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 906 may not generate gas during the following thermal process. After heating and hardening the adhesive 906, the fan-out package structure 905 with the dies 903 will be jointed as firmly as one complete object and has uniform thermal expansion during various processes.

Figures 1, 10:
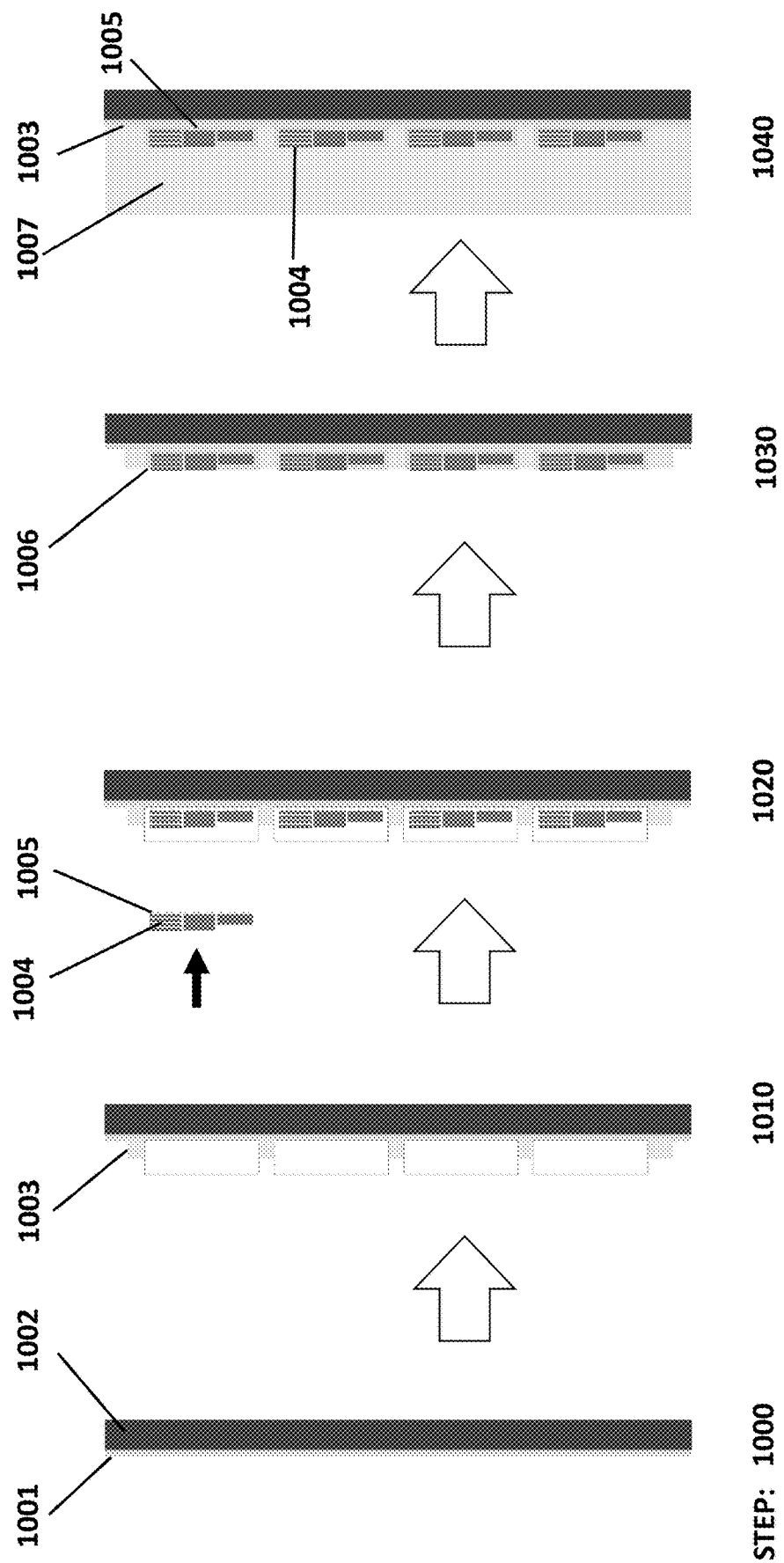
Figures 2, 10:
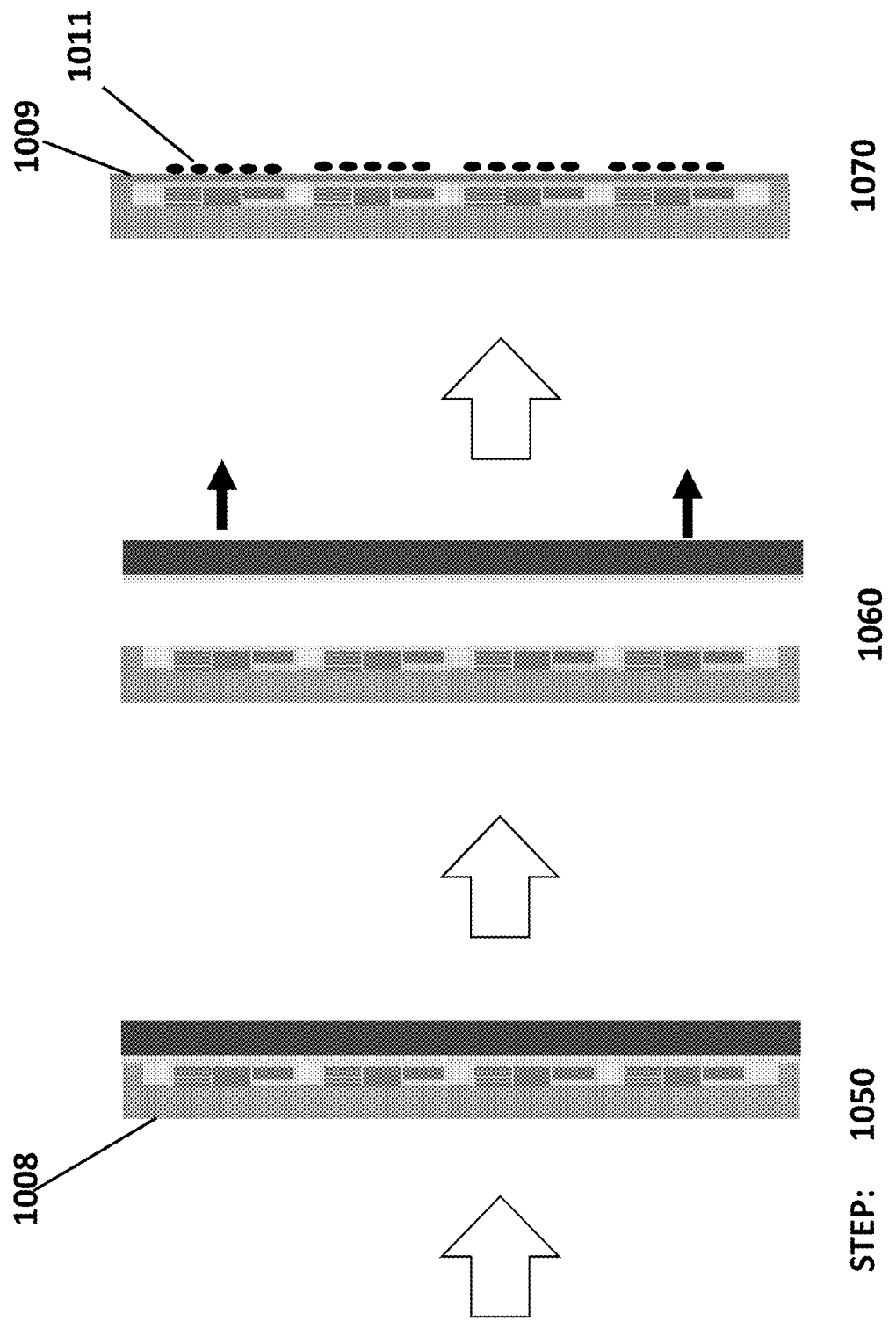

FIG. 10-1 and FIG. 10-2 illustrate the multiple Chip-Last fan-out package process flow using the fan-out package structure and method according to the present disclosure. In STEP 1000, an adhesive film 1001 is applied on a carrier 1002. In STEP 1010, a fan-out package structure 1003 is placed on the top surface of the adhesive film 1001 on the carrier 1002 accordingly. In STEP 1020, known good dies (KGDs) 1004, such as thin die, thicker die and/or stacking dies 104 each having metal pads 1005 formed thereon are picked and placed into corresponding cavities formed on the fan-out package structure 1003 precisely such that the metal pads 1005 of the dies 1004 are positioned to face the carrier 1002. In this embodiment, each of the cavities may be arranged to receive only one of the dies 1004. In STEP 1030, an adhesive 1006 that has similar coefficient of thermal expansion (CTE) with the dies 1004 is filled in the cavities to surround the dies 1004. In STEP 1040, the adhesive 1006 is heated with hot atmosphere 1007 so that the adhesive 1006 filled in the cavities is hardened to fix and confine the dies 1004. Therefore, a package including the fan-out package structure 1003 and the dies 1004 surrounded by the hardened adhesives 1006 is formed and attached to the carrier 1002 by the adhesive film 1001. In STEP 1050, an epoxy molding compound (EMC) 1008 is formed over the fan-out package structure 1003 and the adhesive film 1001 and around the dies 1004 by a wafer/panel overmolding process. In STEP 1060, the adhesive film 1001 and the carrier 1002 are removed from the package formed in STEP 1050. In STEP 1070, thin-film redistribution layers (RDLs) 1009 are formed to electrically connect the metal pads 1005 and solder balls 1011 are then placed on the thin-film redistribution layers (RDLs) 1009. Therefore, a semiconductor package including the dies 1004 covered by the thin-film redistribution layers (RDLs) 1009, the epoxy molding compound (EMC) 1008 and the solder balls 1011 disposed on the thin-film redistribution layers (RDLs) 1009 is finally formed.

The adhesive 1006 may be an epoxy adhesive or be composed of and mixed with glass powder, filler, binder and some additives. The adhesive 1006 may be low coefficient of thermal expansion (CTE) epoxy. The adhesive 1006 has similar and as close as the coefficient of thermal expansion (CTE) with the dies 1004. The coefficient of thermal expansion (CTE) of the adhesive 1006 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 1006 may not generate gas during the following thermal process. After heating and hardening the adhesive 1006, the fan-out package structure 1003 with the dies 1004 will be jointed as firmly as one complete object and has uniform thermal expansion during various processes.

Figure 11:
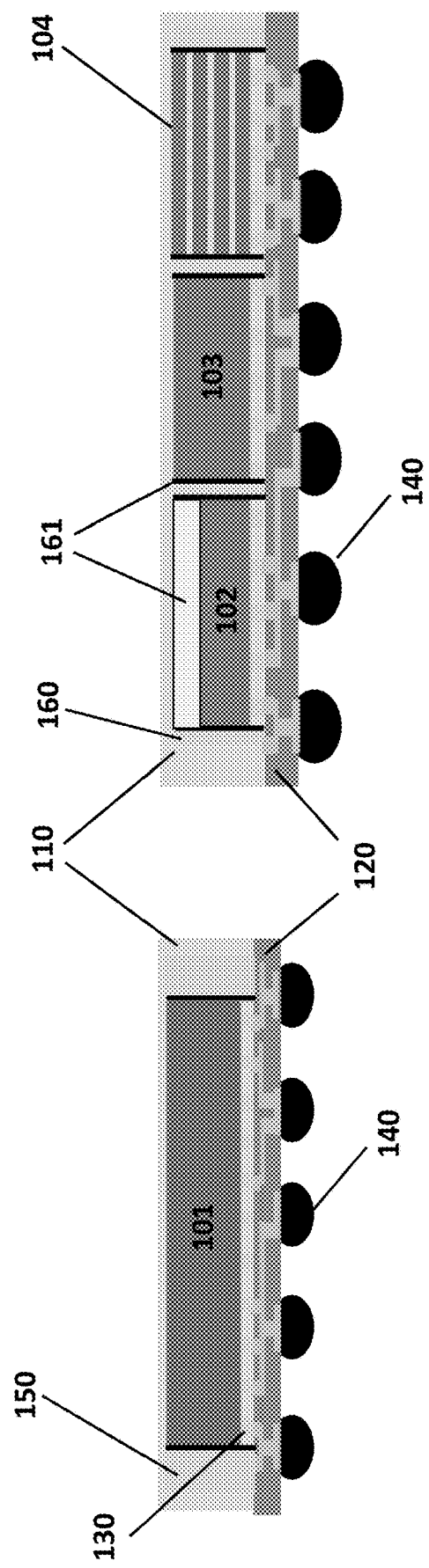
FIG. 11 is a cross-sectional view illustrating the example of single chip and multiple chips application in fan-out package with a fan-out package structure according to the present disclosure.

FIG. 11 is a cross-sectional view illustrating the example of single chip and multiple chips application in fan-out package with a fan-out package structure according to the present disclosure. A single die 101 is fixed in a fan-out package structure 150 by applying an adhesive 161. Multiple dies including, a thin die 102, a thicker die 103, and stacking dies 104 are fixed in a fan-out package structure 160 by applying the adhesive 161. The fan-out package structure 150 with the single die 101 and the fan-out package structure 160 with the multiple dies including the thin die 102, the thicker die 103 and the stacking dies 104 are respectively embedded in the wrap of an epoxy molding compound (EMC) 110 and connect thin-film redistribution layers (RDLs) 120 with metal pads 130. On the other side of the thin-film redistribution layers (RDLs) 120 are placed with solder balls 140.

The adhesive 161 may be an epoxy adhesive or be composed of and mixed with glass powder, filler, binder and some additives. The adhesive 161 may be low coefficient of thermal expansion (CTE) epoxy. The adhesive 161 has similar and as close as the coefficient of thermal expansion (CTE) with the dies 101-104. The coefficient of thermal expansion (CTE) of the adhesive 161 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 161 may not generate gas during the following thermal process. After heating and hardening the adhesive 161, the fan-out package structures 150, 160 with the dies 101-104 will be jointed as firmly as one complete object and has uniform thermal expansion during various processes.

Figures 1, 12:
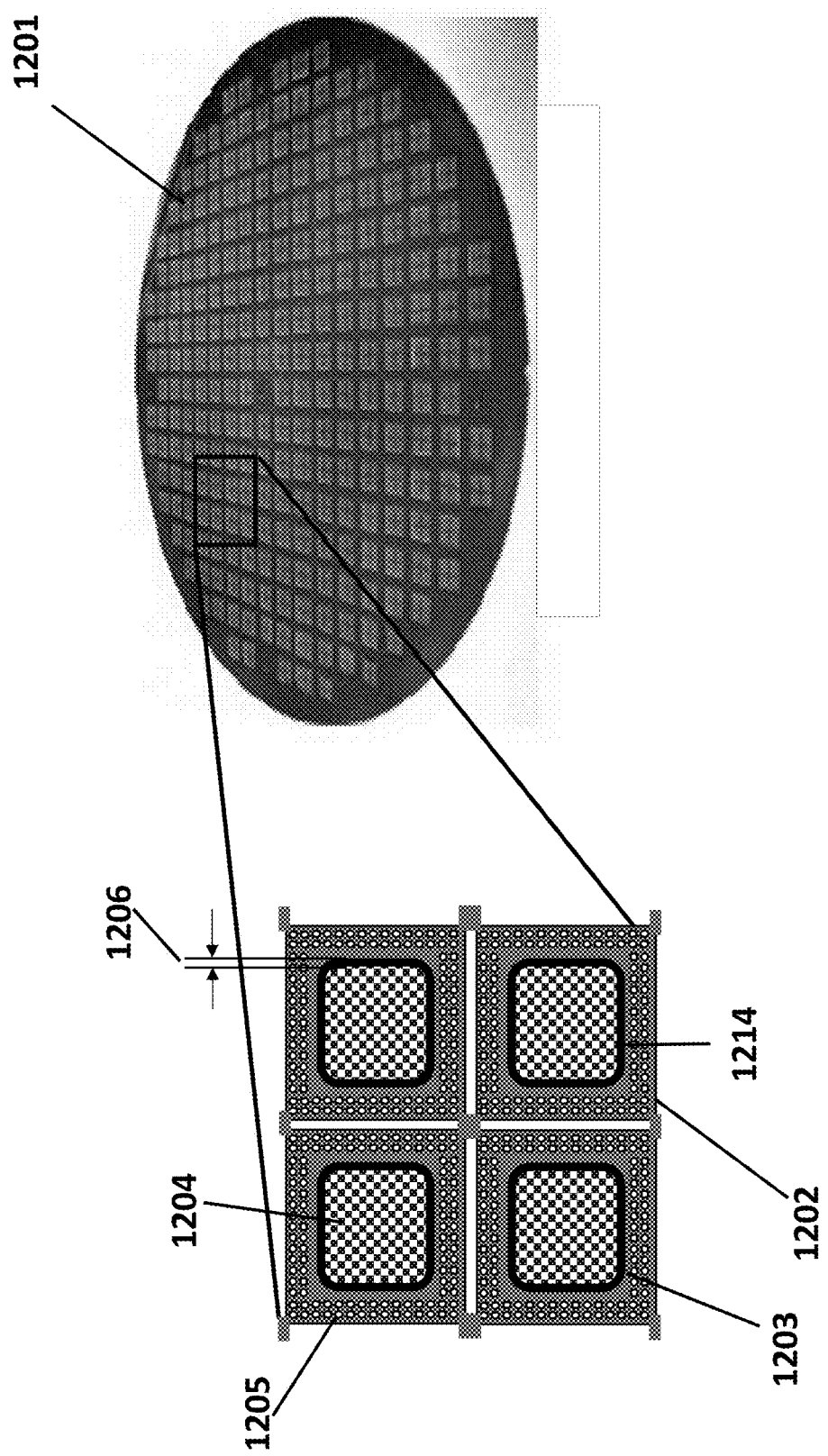
Figures 2, 12:
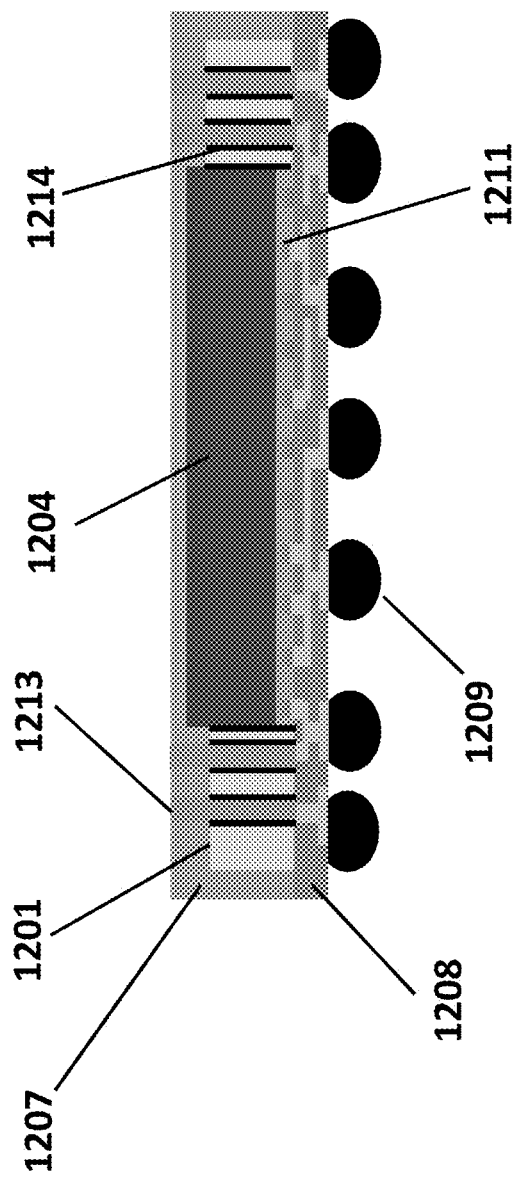

FIG. 12-1 and FIG. 12-2 are block and cross-sectional views respectively to illustrate the example of single Chip-First fan-out package application according to the present disclosure. Referring to FIG. 12-1, a fan-out package structure 1201 in wafer form includes many blocks 1202, wherein each of the blocks 1202 has a die 1204 disposed and fixed in one of cavities 1203 by applying an adhesive 1214. A plurality of through vias/holes 1205 is formed on the fan-out package structure 1201 and located around the cavities 1203. The gap 1206 between the die 1204 and the cavity 1203 may be filled with the adhesive 1214 that has similar coefficient of thermal expansion (CTE) with the die 1204 and fan-out package structure 1201.

Referring to FIG. 12-2, a single die 1204 is confined in a cavity of the fan-out package structure 1201 and embedded in the wrap of an epoxy molding compound (EMC) 1207. The die 1204 electrically connects thin-film redistribution layers (RDLs) 1208 with metal pads 1211. On the other side of the thin-film redistribution layers (RDLs) 1208 are placed with solder balls 1209. The through-hole metal interconnections 1213 are located inside the through holes/vias of fan-out package structure 1201 respectively. The through-hole metal interconnections 1213 penetrate the fan-out package structure 1201 and the epoxy molding compound (EMC) 1207 to electrically connect the redistribution layers 1208.

The adhesive 1214 may be an epoxy adhesive or be composed of and mixed with glass powder, filler, binder and some additives. The adhesive 1214 may be low coefficient of thermal expansion (CTE) epoxy. The adhesive 1214 has similar and as close as the coefficient of thermal expansion (CTE) with the die 1204. The coefficient of thermal expansion (CTE) of the adhesive 1214 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 1214 may not generate gas during the following thermal process. After heating and hardening the adhesive 1214, the fan-out package structure 1201 with the die 1204 will be jointed as firmly as one complete object and has uniform thermal expansion during various processes.

Figures 1, 13:
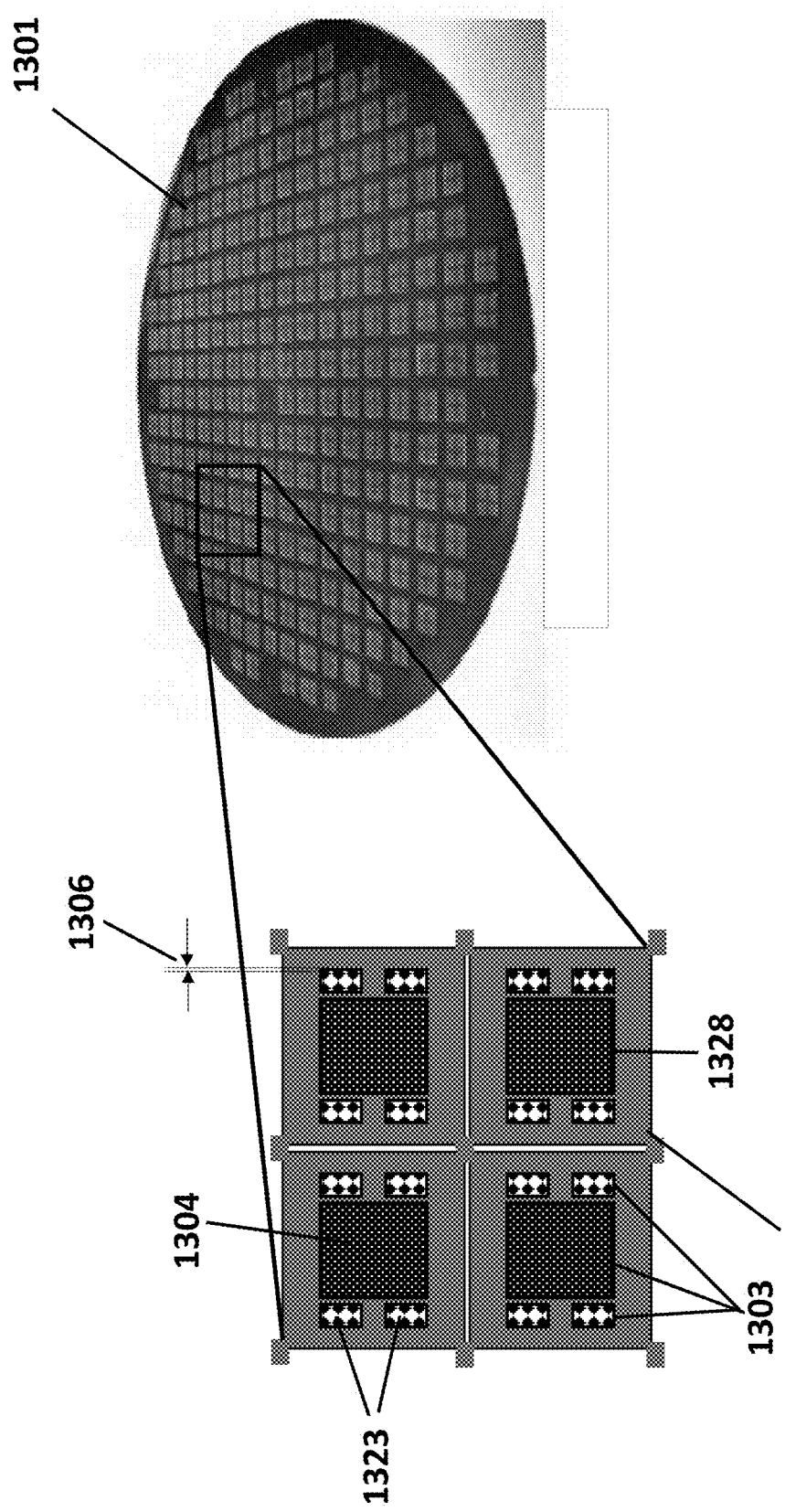
Figures 2, 13:
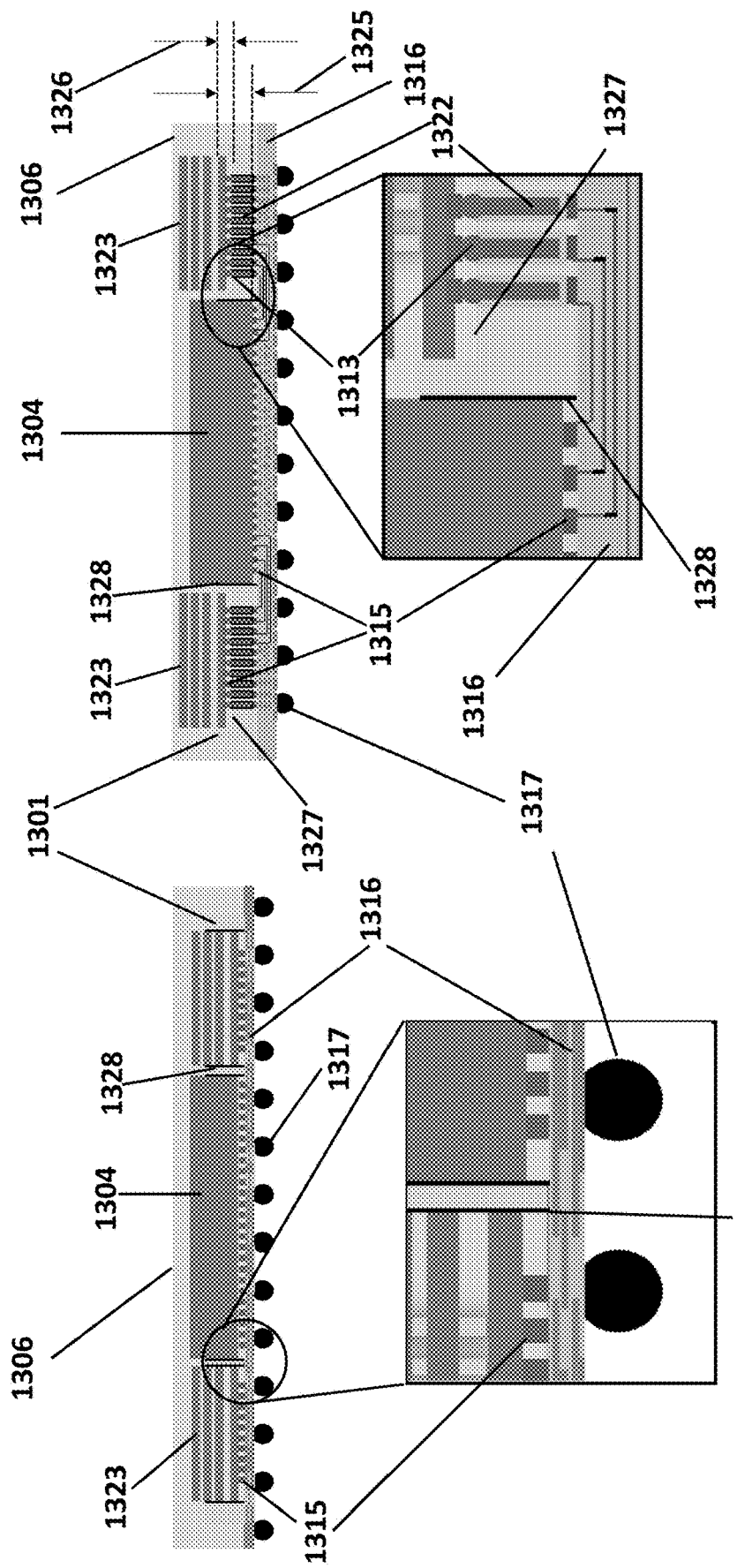

FIG. 13-1 and FIG. 13-2 are block and cross-sectional views respectively to illustrate the example of multiple Chips-First fan-out package application according to the present disclosure. Referring to FIG. 13-1, a fan-out package structure 1301 in wafer form includes many blocks 1302, wherein each of the blocks 1302 has a large semiconductor die 1304 and small stacking semiconductor dies 1323 disposed in one of cavities 1303 respectively by applying the adhesive 1328. The gap 1306 between the edges of the dies 1304, 1323 and the edge of the cavity 1303 may be filled with the adhesive 1328 that has similar coefficient of thermal expansion (CTE) with the dies 1304, 1323 and the fan-out package structure 1301.

Referring to the left portion of FIG. 13-2, a large die 1304 and small stacking dies 1323 are confined and fixed in the corresponding cavities of the fan-out package structure 1301 by applying the adhesive 1328 that has similar coefficient of thermal expansion (CTE). The fan-out package structure 1301 with the dies 1304, 1323 is embedded in the wrap of an epoxy molding compound (EMC) 1306. The fan-out package structure 1301 electrically connects thin-film redistribution layers (RDLs) 1316 with metal pads 1315. On the other side of the thin-film redistribution layers (RDLs) 1316 are placed with solder balls 1317.

Referring to the right portion of FIG. 13-2, a large die 1304 is confined and fixed in the cavity of a fan-out package structure 1301 by applying an adhesive 1328 that has similar coefficient of thermal expansion (CTE) with the die 1304, and small stacking dies 1323 are placed on the top of corresponding recesses 1327 of the fan-out package structure 1301. The through fan-out package structure interconnections (TPIs) 1322 embedded in the fan-out package structure 1301 are metal interconnections and located under the small stacking dies 1323. The metal interconnections 1322 are provided to electrically connect the small stacking dies 1323 to thin-film redistribution layers (RDLs) 1316 disposed below the fan-out package structure 1301. Metal pads 1315 located at the bottom of the stacking dies 1323 are connected to the top of the metal interconnections 1322 with solder balls 1313 disposed in between. The fan-out package structure 1301 with the dies 1304, 1323 is embedded in the wrap of an epoxy molding compound (EMC) 1306 and electrically connects the thin-film redistribution layers (RDLs) 1316 with metal pads 1315. On the other side of the thin-film redistribution layers (RDLs) 1316 are placed with solder balls 1317.

The adhesive 1328 may be an epoxy adhesive or be composed of and mixed with glass powder, filler, binder and some additives. The adhesive 1328 may be low coefficient of thermal expansion (CTE) epoxy. The adhesive 1328 has similar and as close as the coefficient of thermal expansion (CTE) with the dies 1304, 1323. The coefficient of thermal expansion (CTE) of the adhesive 1328 may be smaller than 10 ppm/° C. in comparison with the silicon's CTE of 2.6 ppm/° C. It is important to use a material having a similar coefficient of thermal expansion because it helps reduce the thermal and mechanical stresses in the joint interface. Moreover, the adhesive 1328 may not generate gas during the following thermal process. After heating and hardening the adhesive 1328, the fan-out package structure 1301 with the dies 1304, 1323 will be jointed as firmly as one complete object and has uniform thermal expansion during various processes.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A method of forming a semiconductor package, comprising:
    attaching a fan-out package structure to a carrier, the fan-out package structure having a cavity formed thereon;
    disposing at least one die in the cavity of the fan-out package structure;
    after the at least one die is disposed in the cavity of the fan-out package structure, filling an adhesive in the cavity of the fan-out package structure to surround the at least one die, wherein the adhesive has a coefficient of thermal expansion (CTE) that is smaller than 10 ppm/° C.;
    hardening the filled adhesive to fix the at least one die in the cavity of the fan-out package structure;
    forming a molding compound over the fan-out package structure; and
    removing the carrier.

2. The method as claimed in claim 1, wherein
    the at least one die has metal pads formed thereon, and
    the metal pads are positioned to face the carrier when the at least one die is disposed in the cavity of the fan-out package structure.

3. The method as claimed in claim 2, further comprising:
    forming a redistribution layer to electrically connect the metal pads; and
    disposing solder balls on the redistribution layer.

4. The method as claimed in claim 1, wherein the filled adhesive is hardened by heating.

5. The method as claimed in claim 1, wherein the at least one die comprises stacking dies disposed in the cavity of the fan-out package structure.

6. The method as claimed in claim 1, wherein the adhesive is an epoxy adhesive or is mixed with glass powder.

7. A method of forming a semiconductor package, comprising:
    attaching a fan-out package structure to a first carrier, the fan-out package structure having a cavity formed thereon;
    disposing at least one die in the cavity of the fan-out package structure;
    after the at least one die is disposed in the cavity of the fan-out package structure, filling an adhesive in the cavity of the fan-out package structure to surround the at least one die, wherein the adhesive has a coefficient of thermal expansion (CTE) that is smaller than 10 ppm/° C.;
    hardening the filled adhesive to fix the at least one die in the cavity of the fan-out package structure, wherein a first package comprising the fan-out package structure and the at least one die is formed, the first package having opposing first surface and second surface, the second surface being attached to the first carrier;
    removing the first carrier;
    attaching the first surface of the first package on a second carrier;
    forming a molding compound over the first package; and
    removing the second carrier.

8. The method as claimed in claim 7, wherein
    the at least one die has metal pads formed thereon, and
    the metal pads are positioned to face the first carrier when the at least one die is placed in the cavity of the fan-out package structure.

9. The method as claimed in claim 8, wherein the molding compound covers the metal pads, the method comprising:
    removing at least a portion of the molding compound to expose the metal pads out.

10. The method as claimed in claim 9, further comprising:
    forming a redistribution layer to electrically connect the metal pads; and
    disposing solder balls on the redistribution layer.

11. The method as claimed in claim 7, wherein the filled adhesive is hardened by heating.

12. The method as claimed in claim 7, wherein the at least one die comprises stacking dies disposed in the cavity of the fan-out package structure.

13. The method as claimed in claim 7, wherein the adhesive is an epoxy adhesive or is mixed with glass powder.

* * * * *